United States Patent
Yamagata

(10) Patent No.: US 8,004,370 B2
(45) Date of Patent: Aug. 23, 2011

(54) SURFACE ACOUSTIC WAVE ELEMENT, SURFACE ACOUSTIC WAVE APPARATUS, AND COMMUNICATION APPARATUS

(75) Inventor: Yoshifumi Yamagata, Kyoto (JP)

(73) Assignee: Kyocera Corporation, Kyoto (JP)

(*) Notice: Subject to any disclaimer, the term of this patent is extended or adjusted under 35 U.S.C. 154(b) by 156 days.

(21) Appl. No.: 12/242,736

(22) Filed: Sep. 30, 2008

(65) Prior Publication Data

US 2009/0096551 A1 Apr. 16, 2009

Related U.S. Application Data

(63) Continuation-in-part of application No. PCT/JP2007/057286, filed on Mar. 30, 2007.

(30) Foreign Application Priority Data

Mar. 31, 2006 (JP) ................. 2006-100643

(51) Int. Cl.
*H03H 9/64* (2006.01)
*H03H 9/72* (2006.01)
*H03H 3/08* (2006.01)

(52) U.S. Cl. .... 333/133; 333/193; 333/195; 310/313 D; 310/346

(58) Field of Classification Search .............. 333/133, 333/193–196; 310/313 B, 313 D, 341, 346
See application file for complete search history.

(56) References Cited

U.S. PATENT DOCUMENTS

| | | | | |
|---|---|---|---|---|
| 6,310,422 B1 * | 10/2001 | Satoh et al. | ............... | 310/313 R |
| 6,445,261 B1 * | 9/2002 | Yuda et al. | ............... | 333/133 |
| 6,737,936 B2 * | 5/2004 | Noguchi | ............... | 333/133 |
| 7,385,464 B2 * | 6/2008 | Shibagaki et al. | ............ | 333/133 |
| 2003/0058064 A1 | 3/2003 | Nakano | | |
| 2005/0285700 A1 * | 12/2005 | Koga et al. | .................... | 333/133 |

FOREIGN PATENT DOCUMENTS

| | | | |
|---|---|---|---|
| JP | 06-029779 | | 2/1994 |
| JP | 07-154201 | * | 6/1995 |
| JP | 10-303698 | | 11/1998 |
| JP | 2000-196407 | * | 7/2000 |
| JP | 2000-312127 A | | 11/2000 |
| JP | 2001-196407 A | | 7/2001 |
| JP | 2001-251027 A | | 9/2001 |
| JP | 2001-345675 A | | 12/2001 |
| JP | 2003-101374 A | | 4/2003 |
| JP | 2003-332884 | * | 11/2003 |
| JP | 2003-332884 A | | 11/2003 |
| JP | 2005-123432 A | | 5/2005 |
| JP | 2006-042007 | * | 2/2006 |
| JP | 2006-100643 | | 4/2006 |
| JP | 2006-100644 | | 4/2006 |
| WO | WO-99/46857 | | 9/1999 |

OTHER PUBLICATIONS

English language machine translation of JP 2003-332884 published Nov. 21, 2003.*

(Continued)

*Primary Examiner* — Barbara Summons
(74) *Attorney, Agent, or Firm* — Birch, Stewart, Kolasch & Birch, LLP

(57) ABSTRACT

The invention provides a surface acoustic wave element having improved heat dissipation and power durability. These characteristics are achieved by configuring the SAW such that either of an input or ground electrode is disposed between serial arm portions of the SAW comprising resonators.

13 Claims, 12 Drawing Sheets

OTHER PUBLICATIONS

English language machine translation of JP 07-154201 published Jun. 16, 1995.*

English language machine translation of JP 2000-196407 published Jul. 14, 2000.*

* cited by examiner

SURFACE ACOUSTIC WAVE ELEMENT, SURFACE ACOUSTIC WAVE APPARATUS, AND COMMUNICATION APPARATUS

RELATED APPLICATIONS

This application is a Continuation-In-Part under 35 USC §120 of the International Application PCT/JP2007/057286, filed Mar. 30, 2007, which in turn claims priority under 35 USC §119(a)-(d) of Japanese Application JP2006-100643, filed Mar. 31, 2006. The entire contents of all of the above applications are hereby incorporated by reference.

BACKGROUND OF THE INVENTION

1. Field of the Invention

The present invention generally relates to a surface acoustic wave element, a surface acoustic wave apparatus that has the surface acoustic wave element, and a communication apparatus that has the surface acoustic wave apparatus. In particular, the invention relates to a surface acoustic wave element as well as a surface acoustic wave apparatus that is used in or as a duplexer or used in or as a composite filter that has a plurality of filters having band pass frequency ranges that are different from one another. In addition, the invention relates to a communication apparatus that has such a duplexer or composite filter comprising a surface acoustic wave apparatus of the invention.

2. Description of the Related Art

In the technical field of a communication apparatus such as a mobile phone, a surface acoustic wave apparatus that is provided with a surface acoustic wave element, known as a SAW device, is used as a duplexer or a filter (e.g., branching filter), though not limited thereto.

When a surface acoustic wave apparatus is in operation, the temperature of an inter-digital transducer (IDT) electrode as well as its peripheral temperature measured in the neighborhood thereof goes up as the power level of an input signal increases. As one reason for such a temperature increase, oscillation/vibration loss converts to thermal energy, that is, heat, at the IDT electrode, which constitutes a part of each surface acoustic wave resonator of the surface acoustic wave apparatus. As another reason therefor, Joule heat is generated due to electrode line resistance. When the temperature of the IDT electrodes goes up, there occurs a problem of deterioration in the power durability of a surface acoustic wave apparatus because, as a result of such an IDT temperature increase, stress migration occurs and/or is accelerated, which could cause the breaking of a wire, a short circuit, or the like.

In an effort to overcome such a problem, a technique for suppressing the generation of heat has been proposed so far. An example of such a heat suppression technique of the related art is briefly explained below. In the configuration of a surface acoustic wave element of the related art, one serial resonator is divided into a plurality of serial resonators without changing the overall capacitance thereof. More specifically, a surface acoustic wave resonator that constitutes a serial arm having an electrostatic capacitance of C is split into two resonators with an electrostatic capacitance of 2C. These two resonators having the electrostatic capacitance of 2C are connected in series. In addition, it is disclosed that the number of the electrode fingers of the first stream serial resonator that are in an "engaged" state is made larger than the number of the electrode fingers of the second stream serial resonator. With such a structure, an electric current that flows, per electrode finger, through the comb electrode of the first stream serial resonator is reduced, thereby suppressing a temperature increase. By this means, the heat suppression technique of the related art explained above improves the power durability of a surface acoustic wave filter.

On the other hand, techniques for dissipating heat that is generated in a surface acoustic wave apparatus have also been proposed. However, a heat dissipation technique of the related art has a disadvantage in that it requires a member that has high thermal conductivity, in that the strength of a piezoelectric substrate decreases, and in that it does not offer sufficient heat radiation effects.

Thus, a technique for enhancing the power durability of a surface acoustic wave element/apparatus is needed.

BRIEF DESCRIPTION OF THE DRAWINGS

The object, features, and advantages of the present invention will be fully understood from the following detailed description of the invention read carefully and thoroughly in conjunction with the accompanying drawings. It should be understood that any particular embodiment of the invention might not achieve every object of the invention nor exhibit all of the advantages of the invention.

FIG. 4 shows a sectional view taken along the line IV-IV of each of FIGS. 3A, 3B, and 3C;

DESCRIPTION OF THE INVENTION

Figure 1:
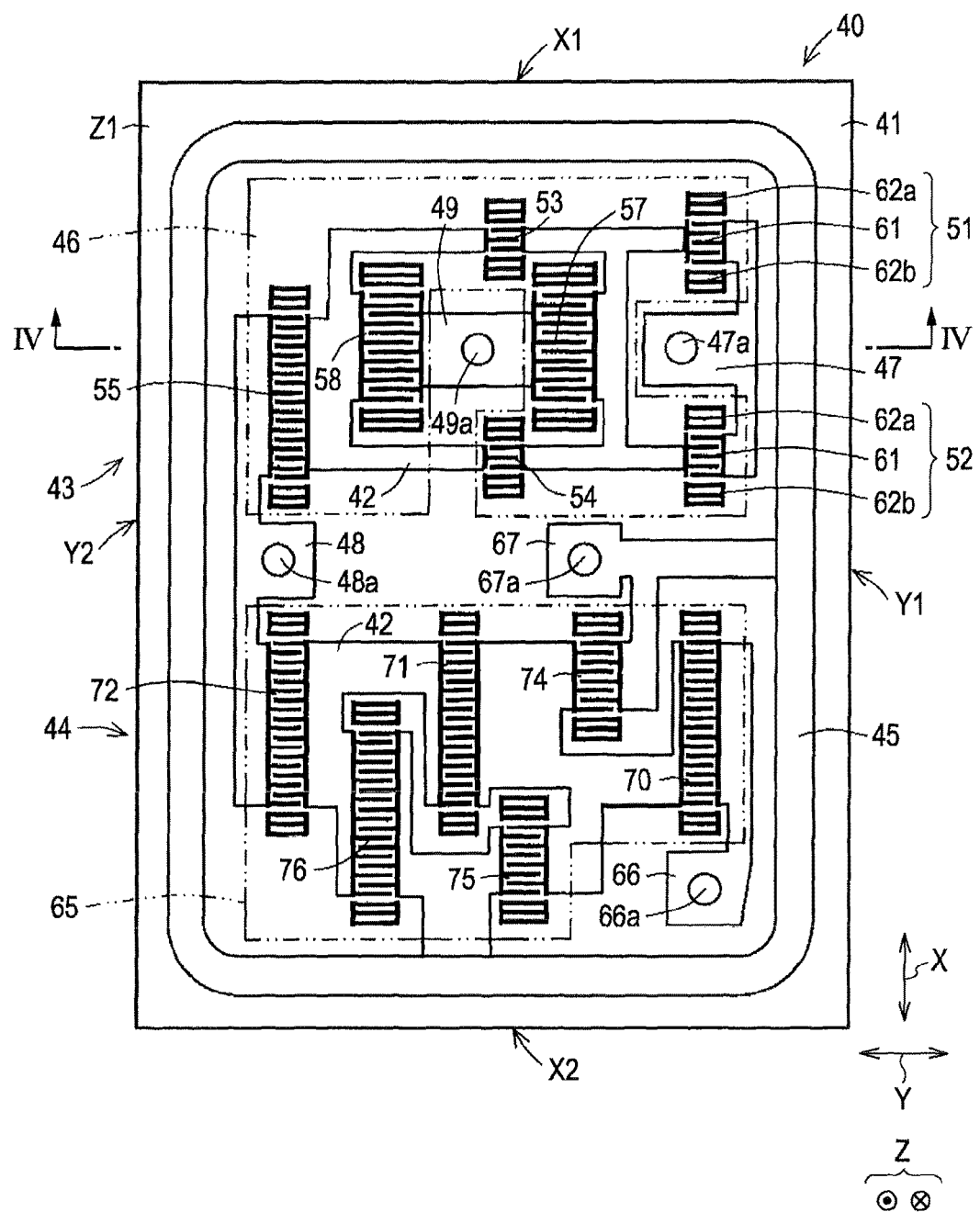
FIG. 1 is a plan view that schematically illustrates an example of the configuration of a surface acoustic wave element according to a first embodiment of the invention.

In order to address the above-identified problems without any limitation thereto, the invention provides, as a first aspect thereof, a surface acoustic wave element that includes: a piezoelectric substrate; a filter that is provided on the piezoelectric substrate; an input electrode that is used for inputting a signal in the filter; an output electrode that is used for outputting a signal from the filter; and a ground electrode to which a ground potential is applied. The filter has at least one serial arm that includes, at least, a resonator; one of the above-mentioned at least one serial arms that is provided closest to the input electrode among all of the above-mentioned at least one serial arms includes a first serial arm portion and a second serial arm portion that are connected in parallel with each other. Each of the first and the second serial arm portions has, at least, a resonator; and either the input electrode or the ground electrode is provided between the first serial arm portion and the second serial arm portion.

In the configuration of a surface acoustic wave element according to the first aspect of the invention described above, it is preferable that the filter should have a second serial arm that is connected to the above-mentioned one serial arm that is provided closest to the input electrode. The second serial arm should include a third serial arm portion and a fourth serial arm portion that are connected in parallel with each other; each of the third serial arm portion and the fourth serial arm portion should have, at least, a resonator; and the ground electrode should be provided between the third serial arm portion and the fourth serial arm portion.

In a preferred configuration of a surface acoustic wave element described above, it is further preferable that the input electrode should be provided between the first serial arm portion and the second serial arm portion, whereas the ground electrode should be provided between the third serial arm portion and the fourth serial arm portion.

In a preferred configuration of a surface acoustic wave element described above, it is further preferable that the ground electrode should include a first ground electrode that is provided between the first serial arm portion and the second serial arm portion and a second ground electrode that is provided between the third serial arm portion and the fourth serial arm portion; and the second ground electrode should be electrically connected to the first ground electrode on the piezoelectric substrate.

In a preferred configuration of a surface acoustic wave element described above, it is further preferable that the ground electrode should include a first ground electrode that is provided between the first serial arm portion and the second serial arm portion and a second ground electrode that is provided between the third serial arm portion and the fourth serial arm portion; and the first ground electrode and the second ground electrode should be provided as two different electrodes that are separated from and/or are independent of each other.

It is preferable that a surface acoustic wave element according to the first aspect of the invention described above should further include a second filter on the piezoelectric substrate, the second filter including at least a resonator, wherein the above-mentioned filter is used as a transmitting filter whereas the second filter is used as a receiving filter.

In the configuration of a surface acoustic wave element according to the first aspect of the invention described above, it is preferable that a ring electrode should be provided at a peripheral area on the surface of the piezoelectric substrate so as to surround the filter.

In the preferred configuration of a surface acoustic wave element described above, it is further preferable that the ring electrode should be grounded.

In order to address the above-identified problems without any limitation thereto, the invention provides, as a second aspect thereof, a surface acoustic wave apparatus that includes: the surface acoustic wave element according to the first aspect of the invention described above; and a circuit board that is provided so as to face the surface of the piezoelectric substrate, the circuit board being used as a board on which the surface acoustic wave element according to the first aspect of the invention described above is mounted.

The circuit board includes:

1) a board connection input terminal that is connected to the input electrode is provided on a first surface of the circuit board, which is the one of two surfaces of the circuit board viewed in the thickness direction thereof on which the surface acoustic wave element according to the first aspect of the invention described above is mounted;

2) a board connection output terminal that is connected to the output electrode is provided on the first surface of the circuit board;

3) a board connection ground terminal that is connected to the ground electrode is provided on the first surface of the circuit board;

4) a wiring connection input terminal that is connected to the board connection input terminal via a terminal connection electrode, which is formed through the circuit board viewed in the thickness direction thereof, is provided on a second surface of the circuit board, which is the other of two surfaces of the circuit board viewed in the thickness direction thereof;

5) a wiring connection output terminal that is connected to the board connection output terminal via the terminal connection electrode is provided on the second surface of the circuit board; and 6) a wiring connection ground terminal that is connected to the board connection ground terminal via the terminal connection electrode is provided on the second surface of the circuit board.

In order to address the above-identified problems without any limitation thereto, the invention provides, as a third aspect thereof, a communication apparatus that includes: a duplexer that has the surface acoustic wave apparatus according to the second aspect of the invention described above; an antenna that is electrically connected to the wiring connection output terminal; and a transceiver section that supplies a signal to the wiring connection input terminal and receives a signal from the wiring connection output terminal.

The present invention also provides a method for reducing the temperature of a filter including a surface acoustic wave (SAW) device. According to this aspect of the invention, the SAW device comprises at least one serial arm having a first serial arm portion comprising one resonator and a second serial arm portion comprising at least one resonator, and the method comprises configuring the resonators of the serial arm portions of the SAW device to have a spacing between them of at least 60 µm, preferably a spacing of from 60 to 120 µm; and placing one of an input electrode or a ground electrode between said first and second serial arm portions.

With reference to the accompanying drawings, illustrative embodiments of the invention are explained in detail below. These embodiments of the invention are illustrative only, and are not to limit the invention, the scope of which is defined by the claims following.

Figure 2:
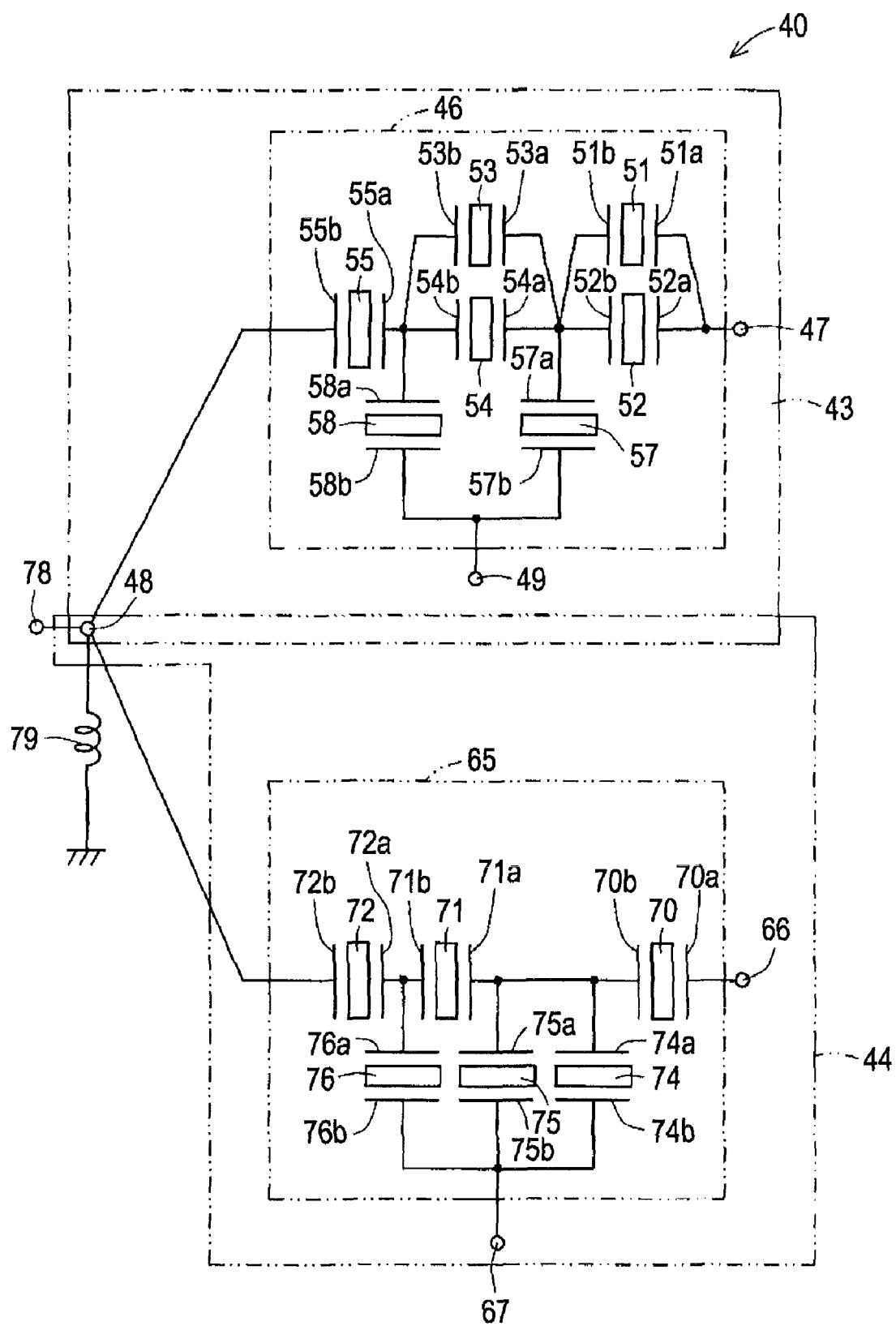
FIG. 2 is a diagram that schematically illustrates an example of an equivalent circuit of the surface acoustic wave element that is shown in FIG. 1.

A surface acoustic wave element 40 according a first exemplary embodiment of the invention, which is shown in FIGS. 1 and 2, includes a piezoelectric substrate 41, a first filter 43, a second filter 44, and a ring electrode 45. Each of the first filter 43 and the second filter 44 is a surface acoustic wave (SAW) filter.

In the configuration of the surface acoustic wave filter 40 according to the presently illustrated embodiment of the invention, the piezoelectric substrate 41 has rectangular surfaces. In the following description of this specification, the length direction of the piezoelectric substrate 41, the width direction thereof, and the thickness direction thereof are defined as X, Y, and Z, respectively. The length direction X, the width direction Y, and the thickness direction Z constitute a three-dimensional orthogonal coordinate system that have the X, Y, and Z axes that are perpendicular to one another. Two "edges" of the piezoelectric substrate 41 that constitute ends thereof in the length direction X are defined herein as a first edge X1 and a second edge X2. Two "sides" of the piezoelectric substrate 41 that constitute ends thereof in the width direction Y are defined herein as a first side Y1 and a second side Y2. Two surfaces of the piezoelectric substrate 41 as viewed in the thickness direction Z thereof are defined herein as a first surface Z1 and a second surface Z2.

The first filter 43, the second filter 44, and the ring electrode 45 are formed on the first surface Z1 of the piezoelectric substrate 41. The first filter 43 is formed at a position/area closer to the first edge X1 in the X direction from the center of the piezoelectric substrate 41. The second filter 44 is formed at a position/area closer to the second edge X2 in the X direction from the center of the piezoelectric substrate 41.

The first filter 43 includes a first group of resonators 46, an input electrode 47, a common electrode 48, a first ground electrode 49, and a connection electrode 42. The first group of resonators 46 makes up a ladder-type filter, which has serial resonators and parallel resonators that are connected in an alternating sequence. The first group of resonators 46 includes a first serial resonator 51, a second serial resonator 52, a third serial resonator 53, a fourth serial resonator 54, a fifth serial resonator 55, a first parallel resonator 57, and a second parallel resonator 58.

A first serial arm includes the first serial resonator 51 and the second serial resonator 52. A second serial arm includes the third serial resonator 53 and the fourth serial resonator 54. A third serial arm includes the fifth serial resonator 55. That is, each of the first serial arm and the second serial arm includes, but is not limited to two serial resonators, whereas the third serial arm includes, but is not limited to one serial resonator. A first parallel arm includes, but is not limited to the first parallel resonator 57. A second parallel arm includes, but is not limited to the second parallel resonator 58.

In the layout configuration of the first group of resonators 46, the first parallel resonator 57 is provided between the first serial arm and the second serial arm. The second parallel resonator 58 is provided between the second serial arm and the third serial arm.

The second filter 44 includes the second group of resonators 65, the common electrode 48, an output electrode 66, a second ground electrode 67, and the connection electrode 42. The second group of resonators 65 makes up a ladder-type filter, which has serial resonators and parallel resonators that are connected in an alternating sequence. The second group of resonators 65 includes a first serial resonator 70, a second serial resonator 71, a third serial resonator 72, a first parallel resonator 74, a second parallel resonator 75, and a third parallel resonator 76.

Each of the first serial resonator 51, the second serial resonator 52, the third serial resonator 53, the fourth serial resonator 54, the fifth serial resonator 55, the first parallel resonator 57, and the second parallel resonator 58 of the first resonator group 46 is a SAW resonator. Each of the first serial resonator 70, the second serial resonator 71, the third serial resonator 72, the first parallel resonator 74, the second parallel resonator 75, and the third parallel resonator 76 of the second resonator group 65 is also a SAW resonator. Each of these SAW resonators includes an inter-digital transducer (IDT) electrode 61 as well as a first reflector 62a and a second reflector 62b. The IDT electrode 61 is a SAW exciter. The first reflector 62a and the second reflector 62b are provided at the both ends of the IDT electrode 61 along the direction of SAW propagation. Hereafter, the first reflector 62a and the second reflector 62b may be collectively referred to as a "reflector 62".

The resonators of the first resonator group 46 are connected with one another via the connection electrode 42. In addition, the resonators of the second resonator group 65 are connected with one another via the connection electrode 42.

The common electrode 48, which has a common pad electrode 48a, functions as the output electrode of the first filter 43, and in addition thereto, as the input electrode of the second filter 44. When viewed in the thickness direction Z, the ring electrode 45 is formed on the piezoelectric substrate 41 so as to enclose the first filter 43 and the second filter 44. The ring electrode 45 is electrically connected to the second ground electrode 67, which has a second ground pad electrode 67a.

The first serial resonator 51, the second serial resonator 52, the third serial resonator 53, the fourth serial resonator 54, the fifth serial resonator 55, the first parallel resonator 57, and the second parallel resonator 58 of the first resonator group 46 have a first electrode terminal 51a, 52a, 53a, 54a, 55a, 57a, and 58a and a second electrode terminal 51b, 52b, 53b, 54b, 55b, 57b, and 58b, respectively.

The common electrode 48 is connected to an antenna terminal 78. A matching circuit unit 79, which is connected in parallel to the first filter 43 and the second filter 44, is provided between the common electrode 48 and the antenna terminal 78. The matching circuit unit 79 is made of a wiring/line that has inductance. The wiring/line having inductance is grounded.

In the configuration of the surface acoustic wave filter 40 according to the present embodiment of the invention, the first filter 43 is used as a transmitting filter that has a first band pass frequency range and the second filter 44 is used as a receiving filter that has a second band pass frequency range, which is higher than the first band pass frequency range. The first band pass frequency range is a frequency range from 824 MHz to 849 MHz while the second band pass frequency range is a frequency range from 869 MHz to 894 MHz, as one among many combinations of pass frequency ranges.

The surface acoustic wave filter 40 explained above while referring to FIGS. 1 and 2 is mounted on a circuit board 80.

The circuit board 80 is made up of a first layer circuit substrate 81 and a second layer circuit substrate 82. The circuit board 80 can be made of, for example, a low temperature co-fired ceramics (LTCC) substrate.

Figure 3A:
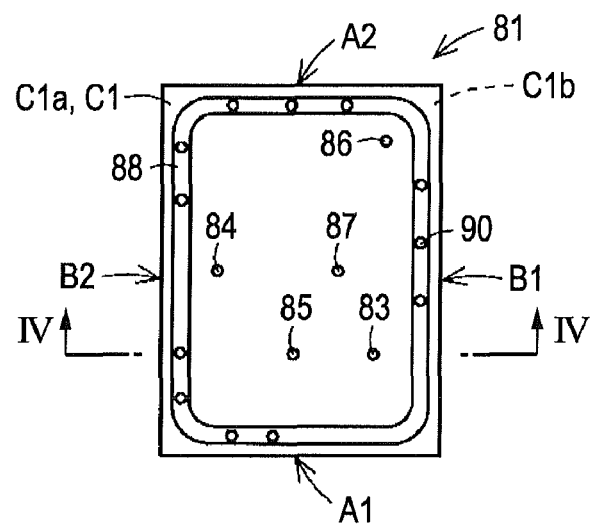
FIG. 3A is a plan view that schematically illustrates an example of the configuration of a first layer circuit substrate.
Figure 3B:
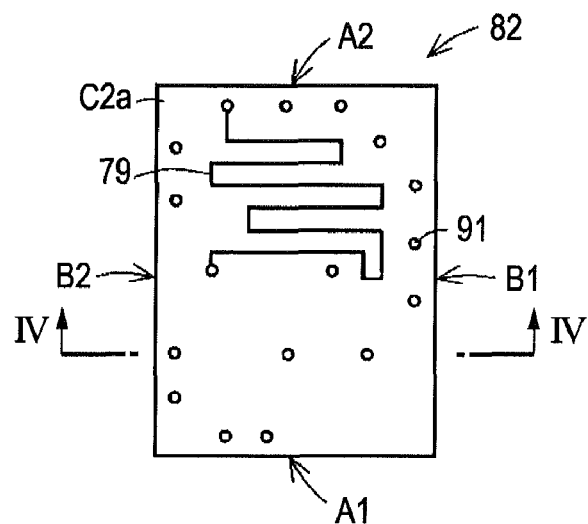
FIG. 3B is a plan view that schematically illustrates an example of the configuration of a second layer circuit substrate.
Figure 3C:
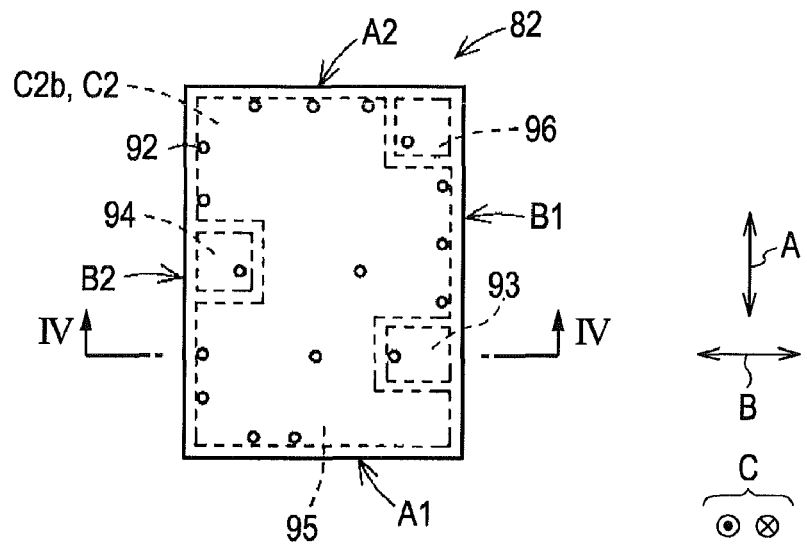
FIG. 3C is a diagram that schematically illustrates an example of the configuration of the second layer circuit substrate that is assumed to be cut along an intermediate plane in the direction of the thickness of the second layer circuit substrate.

In FIGS. 3A, 3B, and 3C, the length direction of the circuit board 80, the first layer circuit substrate 81, and the second layer circuit substrate 82 is defined as A. In addition, the width direction thereof and the thickness direction thereof are defined as B and C, respectively. The length direction A, the width direction B, and the thickness direction C constitute a three-dimensional orthogonal coordinate system that have the A, B, and C axes that are perpendicular to one another.

Two "edges" of the circuit board 80, the first layer circuit substrate 81, and the second layer circuit substrate 82 in the length direction A are defined herein as a first edge A1 and a second edge A2. Two "sides" of the circuit board 80, the first layer circuit substrate 81, and the second layer circuit substrate 82 in the width direction B are defined herein as a first side B1 and a second side B2. Two surfaces of the circuit board 80 as viewed in the thickness direction C thereof are defined herein as a first circuit board surface C1 and a second circuit board surface C2. Two surfaces of the first layer circuit substrate 81 as viewed in the thickness direction C thereof are defined herein as a first surface C1a of the first layer circuit substrate 81 and a second surface C1b of the first layer circuit substrate 81. Two surfaces of the second layer circuit substrate 82 as viewed in the thickness direction C thereof are defined herein as a first surface C2a of the second layer circuit substrate 82 and a second surface C2b of the second layer circuit substrate 82. It should be noted that the first circuit board surface C1 of the circuit board 80 is the same as the first surface C1a of the first layer circuit substrate 81. The second circuit board surface C2 of the circuit board 80 is the same as the second surface C2b of the second layer circuit substrate 82.

The first layer circuit substrate 81 is provided on the first surface C2a of the second layer circuit substrate 82. A first input pad terminal 83, a common pad terminal 84, a first ground pad terminal 85, a second output pad terminal 86, a second ground pad terminal 87, and a ring electrode terminal 88 are provided on the first surface C1a, on which the surface acoustic wave element 40 is mounted, of the first layer circuit substrate 81.

The first input pad terminal 83 becomes electrically connected to a first input pad electrode 47a of the input electrode 47 when the surface acoustic wave element 40 is mounted on the circuit board 80. The common pad terminal 84 becomes electrically connected to the common pad electrode 48a of the common electrode 48 when the surface acoustic wave element 40 is mounted on the circuit board 80. The first ground pad terminal 85 becomes electrically connected to a first ground pad electrode 49a of the first ground electrode 49 when the surface acoustic wave element 40 is mounted on the circuit board 80.

The second output pad terminal 86 becomes electrically connected to a second output pad electrode 66a of the output electrode 66 when the surface acoustic wave element 40 is mounted on the circuit board 80. The second ground pad terminal 87 becomes electrically connected to the second ground pad electrode 67a of the second ground electrode 67 when the surface acoustic wave element 40 is mounted on the circuit board 80. The common pad terminal 84 functions as a first output pad terminal of the first filter 43, and in addition thereto, as a second input pad terminal of the second filter 44.

The ring electrode terminal 88 is formed at the peripheral area on the first surface C1a of the first layer circuit substrate 81. The ring electrode terminal 88 surrounds the first input pad terminal 83, the common pad terminal 84, the first ground pad terminal 85, the second output pad terminal 86, and the second ground pad terminal 87. The ring electrode terminal 88 becomes electrically connected to the ring electrode 45 with the use of and via an electro-conductive member such as tin silver copper solder or the like when the surface acoustic wave element 40 is mounted on the circuit board 80.

A plurality of first feed-through electrodes 90 penetrate through the first layer circuit substrate 81 in the thickness direction C thereof. The plurality of first feed-through electrodes 90 is electrically connected to the first input pad terminal 83, the common pad terminal 84, the first ground pad terminal 85, the second output pad terminal 86, the second ground pad terminal 87, and the ring electrode terminal 88. A board connection input terminal, that is, an input terminal for board connection, corresponds to the first input pad terminal 83. A board connection output terminal, that is, an output terminal for board connection, corresponds to the common pad terminal 84. A board connection ground terminal, that is, a ground terminal for board connection, corresponds to the first ground pad terminal 85.

A plurality of interlayer electrodes 91 and the matching circuit unit 79 are provided between the first layer circuit substrate 81 and the second layer circuit substrate 82. The plurality of interlayer electrodes 91 is connected to the plurality of first feed-through electrodes 90. A plurality of second feed-through electrodes 92 penetrate through the second layer circuit substrate 82 in the thickness direction C thereof. The plurality of second feed-through electrodes 92 is electrically connected to the plurality of first feed-through electrodes 90 via the plurality of interlayer electrodes 91. A terminal connection electrode corresponds to a combination of the first feed-through electrode 90, the interlayer electrode 91, and the second feed-through electrode 92.

A first input terminal 93, a common terminal 94, a common ground terminal 95, and a second output terminal 96 are formed on the second surface C2b of the second layer circuit substrate 82, which is, in other words, the second circuit board surface C2 of the circuit board 80.

The common ground terminal 95 is formed at an area excluding areas where the first input terminal 93, the common terminal 94, and the second output terminal 96 are formed on the second circuit board surface C2 of the circuit board 80.

The first input terminal 93 is electrically connected to the first input pad terminal 83 via the second feed-through electrode 92, the interlayer electrode 91, and the first feed-through electrode 91. The common terminal 94 is electrically connected to the common pad terminal 84 via the second feed-through electrode 92, the interlayer electrode 91, and the first feed-through electrode 91. The common ground terminal 95 is electrically connected to the first ground pad terminal 85 as well as to the second ground pad terminal 87 and the ring electrode terminal 88 via the second feed-through electrode 92, the interlayer electrode 91, and the first feed-through electrode 91. The second output terminal 96 is electrically connected to the second output pad terminal 86 via the second feed-through electrode 92, the interlayer electrode 91, and the first feed-through electrode 91.

Figure 4:
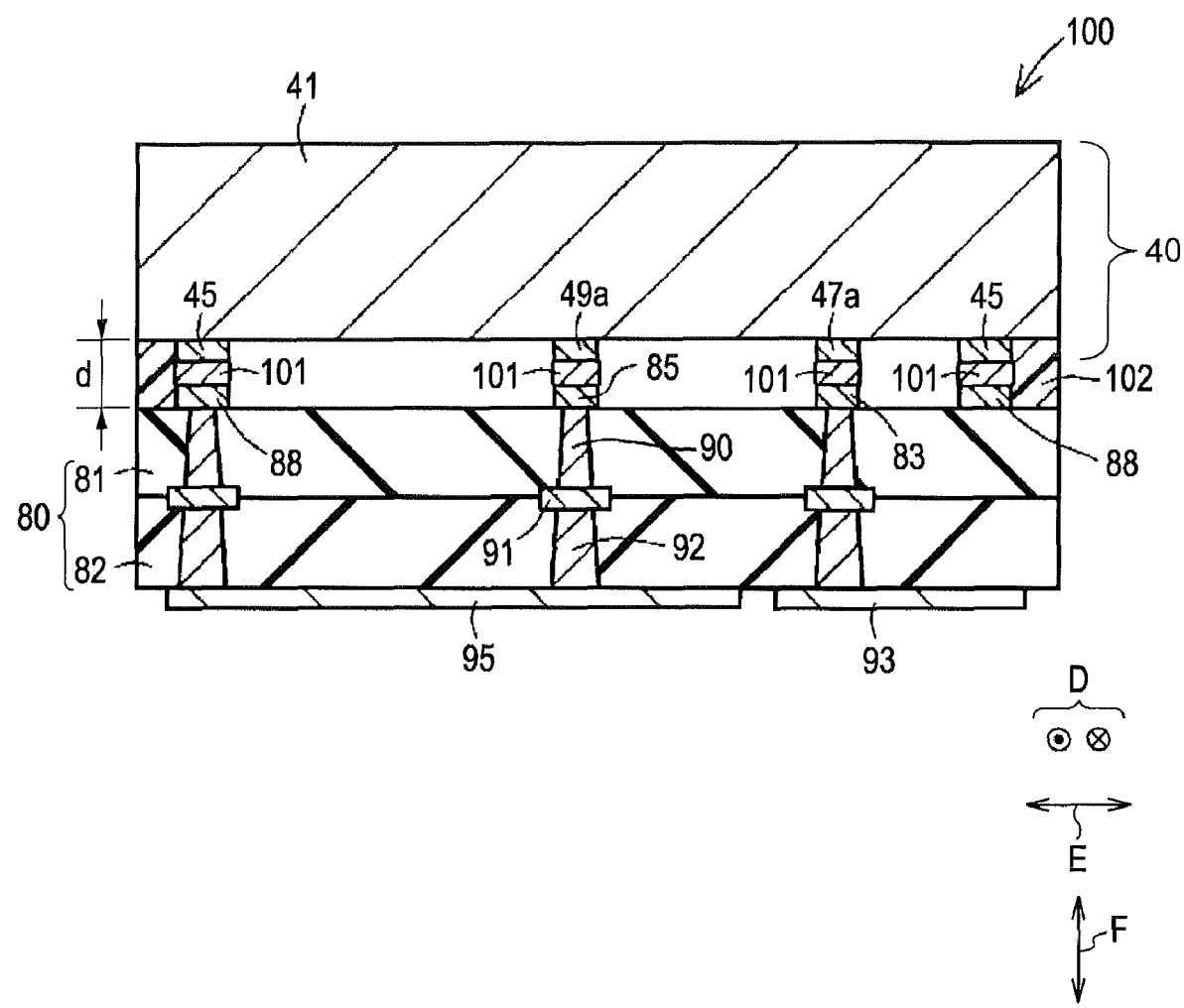
FIG. 4 is a sectional view that schematically illustrates an example of the configuration of a surface acoustic wave apparatus according to the first embodiment of the invention; specifically.

As illustrated in FIG. 4, a surface acoustic wave apparatus 100 has the circuit board 80 and the surface acoustic wave element 40 which is mounted on the circuit board 80. In the following description of this specification, the length direction of the surface acoustic wave apparatus 100, the width direction thereof, and the thickness direction thereof are defined as D E and F, respectively. The length direction D, the width direction E, and the thickness direction F constitute a three-dimensional orthogonal coordinate system that have the D, E, and F axes that are perpendicular to one another. The length direction D of the surface acoustic wave apparatus 100 described herein corresponds to the length direction X of the piezoelectric substrate 41 and the length direction A of the circuit board 80. The width direction E of the surface acoustic wave apparatus 100 described herein corresponds to the width direction Y of the piezoelectric substrate 41 and the width direction B of the circuit board 80. The thickness direction F of the surface acoustic wave apparatus 100 described herein corresponds to the thickness direction Z of the piezoelectric substrate 41 and the thickness direction C of the circuit board 80.

In the following description, an embodiment of a method for manufacturing the surface acoustic wave apparatus 100 according to the present invention is explained. At first, the piezoelectric substrate 41 is subjected to ultrasound cleaning with the use of acetone, isopropyl alcohol, or the like. By this means, an organic component is removed from the piezoelectric substrate 41. Next, the piezoelectric substrate 41 is dried well in a clean oven. Thereafter, a laminated electrode is formed on the first surface Z1 of the piezoelectric substrate 41 by means of a sputtering method. In the embodiment herein described, the laminated electrode is made of titanium (Ti) thin films and aluminum (Al) alloy layer thin films. The aluminum alloy layer thin film contains copper (Cu) of one percent by weight (i.e., one weight percent). Three layers of the titanium (Ti) thin films each having a thickness of 6 nm and three layers of one-percent-weight Cu-containing aluminum alloy layer thin films each having a thickness of 130 nm are laminated one after the other, that is, in an alternate manner, in the order of appearance herein from the first surface Z1 of the piezoelectric substrate 41. In the present exemplary embodiment, the piezoelectric substrate 41 is a 38.7° Y-cut X propagation substrate that may be made of a lithium tantalate single crystal. Notwithstanding the above, however, lithium tantalate can be substituted by lithium tetraborate or lithium niobate, as examples of alternative materials.

Next, a resist is coated/applied thereon/thereto in such a manner that its thickness is approximately 0.5 μm. A desired pattern is formed with use of a reduced projection exposure apparatus, which is a so-called stepper. A developing apparatus dissolves any unnecessary part of the resist film with the use of an alkali liquid developer so as to form a desired resist pattern. Next, the etching of electrodes is performed with the use of a reactive ion etching (RIE) apparatus. After the etching of electrodes, the resist is removed. The patterning is completed in this way.

Through the processes explained above, the first filter 43, the second filter 44, and the ring electrode 45 are formed.

Next, a protective film that is made of silica ($SiO_2$) is formed on the first surface Z1 of the piezoelectric substrate 41 by means of a chemical vapor deposition (CVD) apparatus. The thickness of the protective silica film formed thereon is approximately 20 nm. After the deposition of the protective film thereon, a resist is coated again thereon. Next, some area portions of the resist where the first input pad electrode 47a of the input electrode 47, the common pad electrode 48a of the common electrode 48, the first ground pad electrode 49a of the first ground electrode 49, the second output pad electrode 66a of the output electrode 66, the second ground pad electrode 67a of the second ground electrode 67, and the ring electrode 45 are to be formed are exposed to light so as to remove them. Next, some area portions of the $SiO_2$ protective film where the first input pad electrode 47a of the input electrode 47, the common pad electrode 48a of the common electrode 48, the first ground pad electrode 49a of the first ground electrode 49, the second output pad electrode 66a of the output electrode 66, the second ground pad electrode 67a of the second ground electrode 67, and pad electrodes of the ring electrode 45 are to be formed are removed by means of the RIE method mentioned above.

Next, a chromium (Cr) film, a nickel (Ni) film, and a gold (Au) film are formed in the order of appearance herein with the use of a sputtering method. The thickness of the chromium film is approximately 10 nm. The thickness of the nickel film is approximately 1000 nm. The thickness of the gold film is approximately 100 nm. By this means, a conductive film is formed for the formation of the first input pad electrode 47a, the common pad electrode 48a, the first ground pad electrode 49a, the second output pad electrode 66a, the second ground pad electrode 67a, and the ring electrode 45. The conductive film is formed so as to both electrically and mechanically connect the surface acoustic wave element 40 and the circuit board 80 on which the surface acoustic wave element 40 is mounted with high connection reliability. In a case where soldering is used for the connection of the surface acoustic wave element 40 and the circuit board 80, the conductive film has a function of ensuring good solder wettability and preventing any excessive solder spreading. In a case where gold bump bonding is used for the connection of the surface acoustic wave element 40 and the circuit board 80, a chromium (Cr) film of 10 nm and an aluminum (Al) film of 1000 nm are formed in the order of appearance herein for the formation of each pad electrode. In a case where gold bump bonding is used for the connection of the surface acoustic wave element 40 and the circuit board 80, the conductive film has a function of adjusting the hardness of each pad so that gold bump bonding can be performed with the use of an ultrasonic wave or the like.

As the next step, any unnecessary area portion of the conductive film together with the resist is removed by means of a lift-off method. By this means, the first input pad electrode 47a, the common pad electrode 48a, the first ground pad electrode 49a, the second output pad electrode 66a, the second ground pad electrode 67a, and the ring electrode 45 are formed. Next, the piezoelectric substrate 41 is diced into, that is, divided into, a plurality of the surface acoustic wave elements 40 using a dicing method, which is performed with the use of a dicing blade, or a laser cutting method, which is performed with the use of a laser beam, though not limited thereto. In this way, the plurality of surface acoustic wave elements 40 is manufactured out of the piezoelectric substrate 41.

Next, the surface acoustic wave element 40, which is manufactured as explained above, is mounted onto the circuit board 80 in a "face down" orientation. As has been explained earlier, the circuit board 80 is made of a pair of low temperature co-fired ceramics (LTCC) substrates. The face down bonding of the surface acoustic wave element 40 to the circuit board 80 is performed as follows. As a first step thereof, an electro-conductive member is formed by printing on each of the first input pad terminal 83, the common pad terminal 84, the first ground pad terminal 85, the second output pad terminal 86, the second ground pad terminal 87, and the ring electrode terminal 88 of the circuit board 80. For example, a solder bump 101 is printed on each of these pad terminals 83, 84, 85, 86, and 87 and the ring electrode terminal 88 of the circuit board 80. Next, the surface acoustic wave element 40 is placed in a facedown orientation on the circuit board 80 at such a position that each of the first input pad electrode 47a, the common pad electrode 48a, the first ground pad electrode 49a, the second output pad electrode 66a, the second ground pad electrode 67a, and the ring electrode 45 becomes in contact with the corresponding conductive area portion where the solder bump 101 is formed. Then, after determining the position of the surface acoustic wave element 40 over the circuit board 80 as explained above, the surface acoustic wave element 40 is pressure bonded to the circuit board 80 through the application of an ultrasonic wave thereto. Thereafter, it is reflowed in a nitrogeneous atmosphere (i.e., nitrogen atmosphere) under the temperature condition of 240° C. for hermetic sealing. Since nitrogen is sealed therein, it is possible to improve electrostatic withstand voltage characteristics. Subsequently, a resin 102 such as an epoxy resin is printed thereon by means of a vacuum printer. The printed resin is hardened, for example, at 100° C. for one hour and 150° C. for three hours. Finally, the circuit board 80 is divided into a plurality of individual apparatuses through a dicing process. The surface acoustic wave apparatus 100 is manufactured as explained above. Although it is explained in the foregoing description of the present embodiment of the invention that the solder bump 101 is used as the conductive member, the material of the conductive member is not limited thereto. For example, a gold bump or a conductive paste may be used in place of the solder bump 101.

The surface acoustic wave element 40 is mounted on, that is, bonded to, the circuit board 80 with a gap distance "d" being left between the piezoelectric substrate 41 and the circuit board 80 in the thickness direction F defined above. The gap distance d is set at such a value that is large enough so as not to obstruct the oscillation of any of the resonators of the first resonator group 46 in the first filter 43 and the resonators of the second resonator group 65 in the second filter 44, both of which are formed on the first surface Z1 of the piezoelectric substrate 41. In the configuration of the surface acoustic wave apparatus 100, the distance d is set at 20 µm. An inner space that is formed between the piezoelectric substrate 41 and the circuit board 80 as a result of the mounting of the surface acoustic wave element 40 on the circuit board 80 functions as an oscillation space (i.e., vibration space) in which each resonator of the first resonator group 46 and the second resonator group 65 can oscillate (i.e., vibrate).

In the layout configuration of the first filter 43, which is used as a transmitting filter, the input electrode 47 is provided between the first serial resonator 51 and the second serial resonator 52, which make up the first serial arm. Note that the first serial arm is provided at a position closest to the input electrode 47. In addition, in the layout configuration of the first filter 43, the first ground electrode 49 is provided between the third serial resonator 53 and the fourth serial resonator 54, which make up the second serial arm. By this means, it is possible to radiate heat that is generated at the first serial arm of the first filter 43 and the second serial arm thereof through the input electrode 47 and the first ground electrode 49, respectively.

Heat that is collected at the input electrode 47 propagates through the first input pad electrode 47a thereof toward and to the first input pad terminal 83 of the circuit board 80. Then, this heat further propagates from the first input pad terminal 83 of the circuit board 80 toward and to the first input terminal 93 thereof. As a result thereof, this heat is radiated from the first input terminal 93 of the circuit board 80. On the other hand, heat that is collected at the first ground electrode 49 propagates through the first ground pad electrode 49a thereof toward and to the first ground pad terminal 85 of the circuit board 80. Then, this heat further propagates from the first ground pad terminal 85 of the circuit board 80 toward and to the common ground terminal 95 thereof. As a result thereof, this heat is radiated from the common ground terminal 95 of the circuit board 80. Therefore, it is possible to prevent (e.g., reduce, suppress, or avoid, though not limited thereto) the occurrence and acceleration of stress migration due to an increase in the device temperature of the surface acoustic wave element 40. Thus, the surface acoustic wave element 40 according to the present embodiment of the invention has excellent power dissipation durability characteristics.

The ring electrode 45 also makes it possible to diffuse heat that is generated on the surface acoustic wave element 40. Specifically, heat that is collected at the ring electrode 45 propagates toward and to the ring electrode terminal 88 of the circuit board 80. Then, this heat further propagates from the ring electrode terminal 88 of the circuit board 80 toward and to the common ground terminal 95 thereof. As a result thereof, this heat is radiated from the common ground terminal 95 of the circuit board 80. Thus, it is possible to expect that the occurrence and acceleration of stress migration should be prevented with higher reliability.

Figure 5:
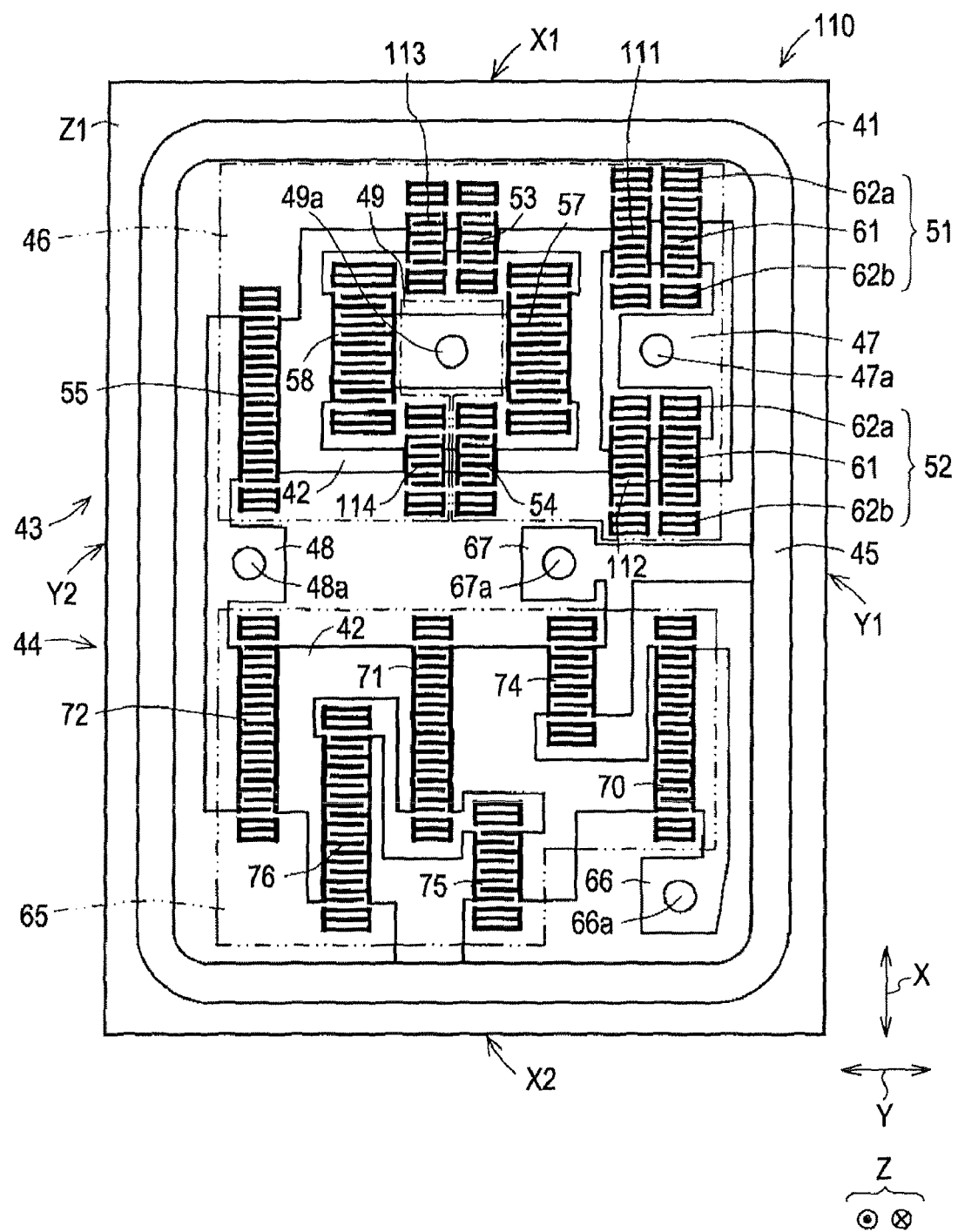
FIG. 5 is a plan view that schematically illustrates an example of the configuration of a surface acoustic wave element according to a second embodiment of the invention.
Figure 6:
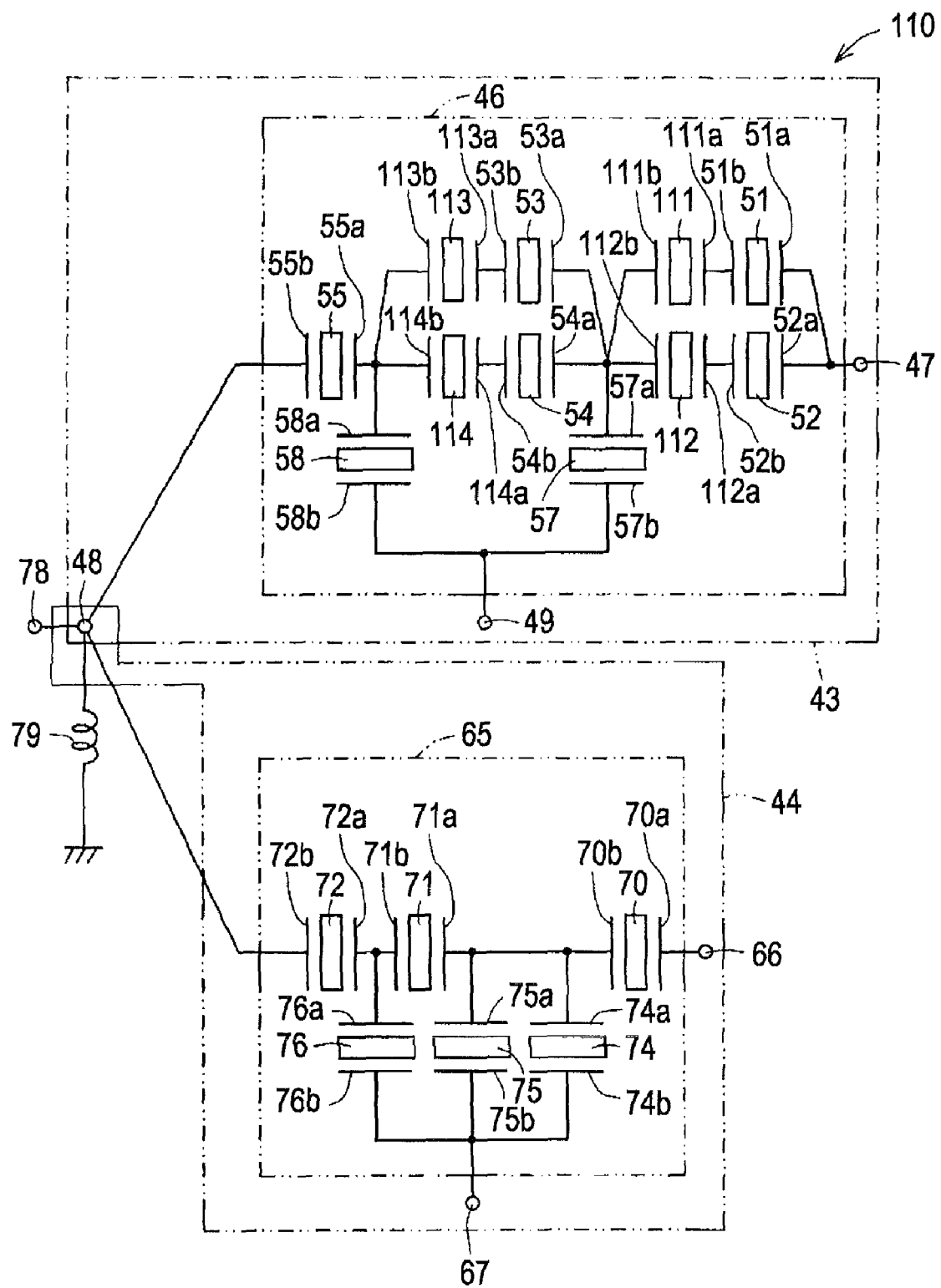
FIG. 6 is a diagram that schematically illustrates an example of an equivalent circuit of the surface acoustic wave element that is shown in FIG. 5.

In the following description, a second exemplary embodiment of the invention is explained while referring to FIGS. 5 and 6. The configuration of a surface acoustic wave element 110 is substantially and/or fundamentally the same, with some exceptions, as that of the surface acoustic wave element 40 according to the first exemplary embodiment of the invention explained above. Therefore, in the following description of the surface acoustic wave element 110, the same reference numerals are consistently used for the same components as those of the surface acoustic wave element 40 according to the first exemplary embodiment of the invention so as to omit, if appropriate, any redundant explanation or simplify explanation thereof.

In the configuration of the surface acoustic wave element 110, the first serial arm of the first group of resonators 46 includes the first serial resonator 51, the second serial resonator 52, the sixth serial resonator 111, and the seventh serial resonator 112. On the other hand, the second serial arm of the first group of resonators 46 includes the third serial resonator 53, the fourth serial resonator 54, the eighth serial resonator 113, and the ninth serial resonator 114.

The sixth serial resonator 111 is provided in the proximity of, for example, adjacent to, the first serial resonator 51. The seventh serial resonator 112 is provided in the proximity of, for example, adjacent to, the second serial resonator 52. The sixth serial resonator 111 and the seventh serial resonator 112 are provided at positions distanced from each other, that is, with a certain distance being left therebetween, in the length direction X defined above.

The eighth serial resonator 113 is provided in the proximity of, for example, adjacent to, the third serial resonator 53. The ninth serial resonator 114 is provided in the proximity of, for example, adjacent to, the fourth serial resonator 54. The eighth serial resonator 113 and the ninth serial resonator 114 are provided at positions distanced from each other, that is, with a certain distance being left therebetween, in the length direction X defined above.

In the layout configuration of the first filter 43, the first input pad electrode 47a of the input electrode 47 is provided between the first serial resonator 51 and the second serial resonator 52 as well as between the sixth serial resonator 111 and the seventh serial resonator 112, which make up the first serial arm. Each of the distance from the second reflector 62b of the first serial resonator 51 to the first reflector 62a of the second serial resonator 52 and the distance from the second reflector 62b of the sixth serial resonator 111 to the first reflector 62a of the seventh serial resonator 112 may be set at an arbitrary value. In the configuration of the surface acoustic wave element 110, the distance mentioned above is set at 60 µm.

On the other hand, in the layout configuration of the first filter 43, the first ground pad electrode 49a of the first ground electrode 49 is provided between the third serial resonator 53 and the fourth serial resonator 54 as well as between the eighth serial resonator 113 and the ninth serial resonator 114, which make up the second serial arm. Each of the distance from the second reflector 62b of the third serial resonator 53 to the first reflector 62a of the fourth serial resonator 54 and the distance from the second reflector 62b of the eighth serial resonator 113 to the first reflector 62a of the ninth serial resonator 114 may be set at an arbitrary value. In the configuration of the surface acoustic wave element 110, the distance mentioned above is set at 80 μm.

Figure 7:
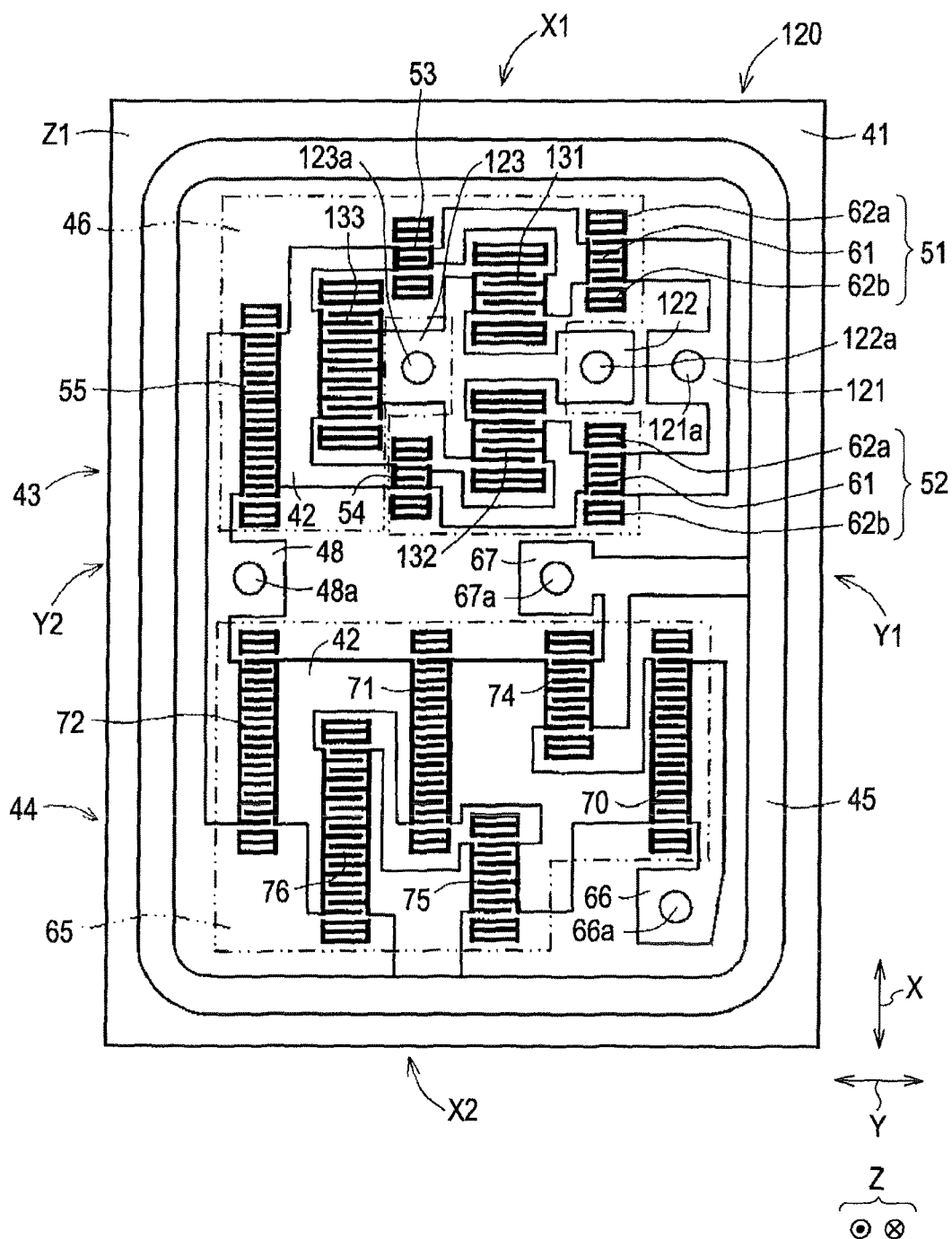
FIG. 7 is a plan view that schematically illustrates an example of the configuration of a surface acoustic wave element according to a third embodiment of the invention.
Figure 8:
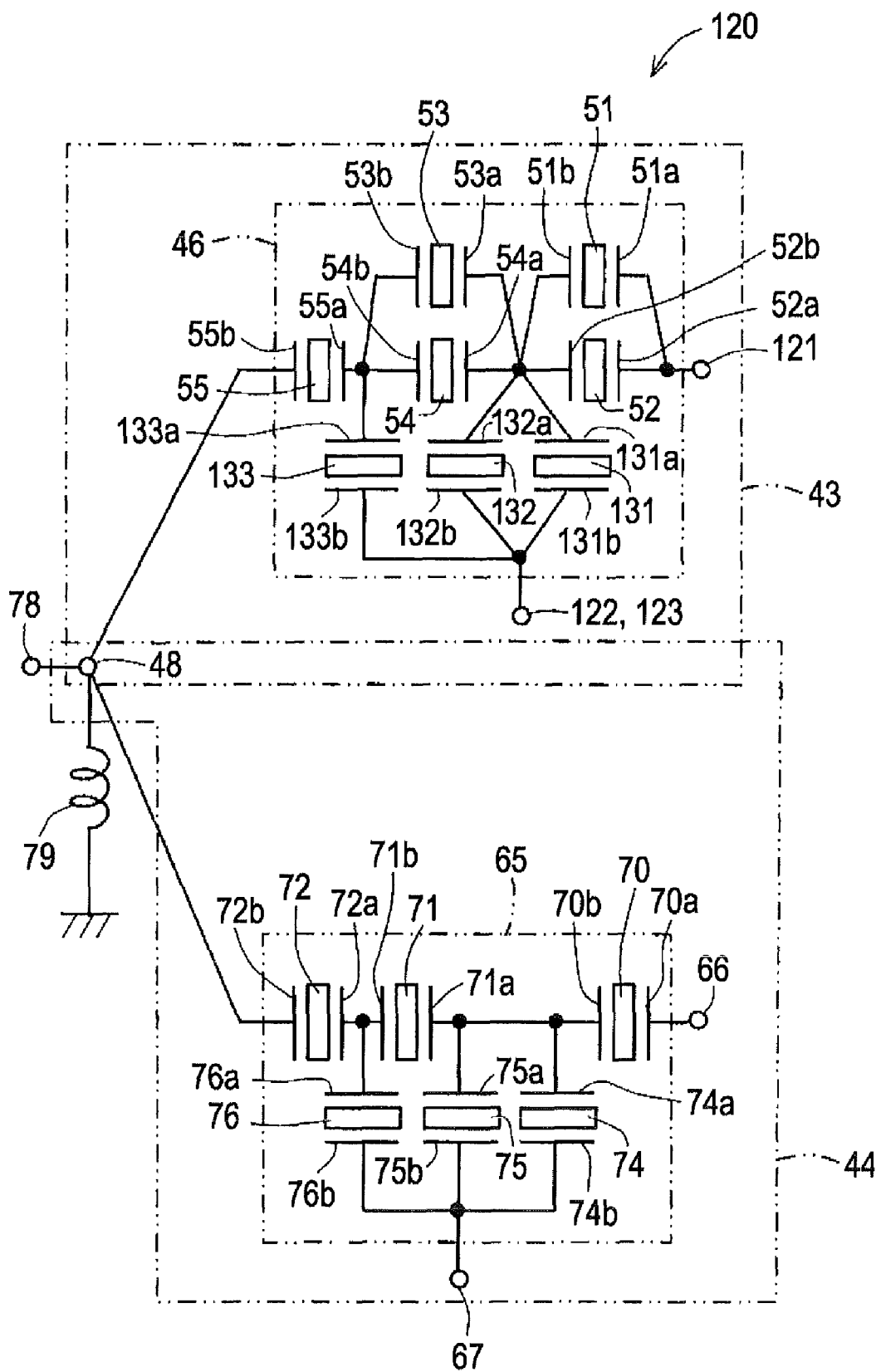
FIG. 8 is a diagram that schematically illustrates an example of an equivalent circuit of the surface acoustic wave element that is shown in FIG. 7.

In the following description, a third exemplary embodiment of the invention is explained while referring to FIGS. 7 and 8. The configuration of a surface acoustic wave element 120 is substantially and/or fundamentally the same, with some exceptions, as that of the surface acoustic wave element 40 explained above. Therefore, in the following description of the surface acoustic wave element 120, the same reference numerals are consistently used for the same components as those of the surface acoustic wave element 40 so as to omit, if appropriate, any redundant explanation or simplify explanation thereof.

The configuration of the first filter 43 of the surface acoustic wave element 120 differs from that of the surface acoustic wave element 40 of the invention explained earlier in that, in the former configuration, a first parallel resonator 131 and a second parallel resonator 132 are connected in parallel so as to constitute two of three parallel arms of the first group of resonators 46. In other words, in the configuration of the first filter 43 of the surface acoustic wave element 120, the first parallel resonator 131, the second parallel resonator 132, and a third parallel resonator 133 constitute a first parallel arm, a second parallel arm, and a third parallel arm, respectively.

In the layout configuration of the first group of resonators 46, the first parallel resonator 131 is provided between the first serial resonator 51 and the third serial resonator 53. The second parallel resonator 132 is provided between the second serial resonator 52 and the fourth serial resonator 54.

An input electrode 121 includes a conductive film and a first input pad electrode 121a. The conductive film of the input electrode 121 extends from the connection electrode 42. The first input pad electrode 121a is formed on the conductive film. A first transmitting ground electrode 122 includes a conductive film and a first transmitting ground pad electrode 122a. The conductive film of the first transmitting ground electrode 122 extends from the connection electrode 42. The first transmitting ground pad electrode 122a is formed on the conductive film. A second transmitting ground electrode 123 includes a conductive film and a second transmitting ground pad electrode 123a. The conductive film of the second transmitting ground electrode 123 extends from the connection electrode 42. The second transmitting ground pad electrode 123a is formed on the conductive film. The first transmitting ground electrode 122 and the second transmitting ground electrode 123 are electrically connected to each other via the connection electrode 42 on the first surface Z1 of the piezoelectric substrate 41. Each of the first input pad electrode 121a of the input electrode 121, the first transmitting ground pad electrode 122a of the first transmitting ground electrode 122, and the second transmitting ground pad electrode 123a of the second transmitting ground electrode 123 is formed to have a projected shape of a circle if it is assumed to be projected on a virtual plane that is perpendicular to the thickness direction Z of the piezoelectric substrate 41.

Each of the first input pad electrode 121a, the first transmitting ground pad electrode 122a, and the second transmitting ground pad electrode 123a is formed substantially at a halfway position between the first edge X1 defined earlier and the center line of the surface acoustic wave element 120 extending in the Y direction and defined as the center when viewed in the length direction X defined earlier.

The first transmitting ground pad electrode 122a of the first transmitting ground electrode 122 is provided between the first serial resonator 51 and the second serial resonator 52.

The distance from the second reflector 62b of the first serial resonator 51 to the first reflector 62a of the second serial resonator 52 may be set at an arbitrary value. In the configuration of the surface acoustic wave element 120, the distance mentioned above is set at 80 μm.

The second transmitting ground pad electrode 123a of the second transmitting ground electrode 123 is provided between the third serial resonator 53 and the fourth serial resonator 54. The distance from the second reflector 62b of the third serial resonator 53 to the first reflector 62a of the fourth serial resonator 54 may be set at an arbitrary value. In the configuration of the surface acoustic wave element 120, the distance mentioned above is set at 100 μm.

Figure 9:
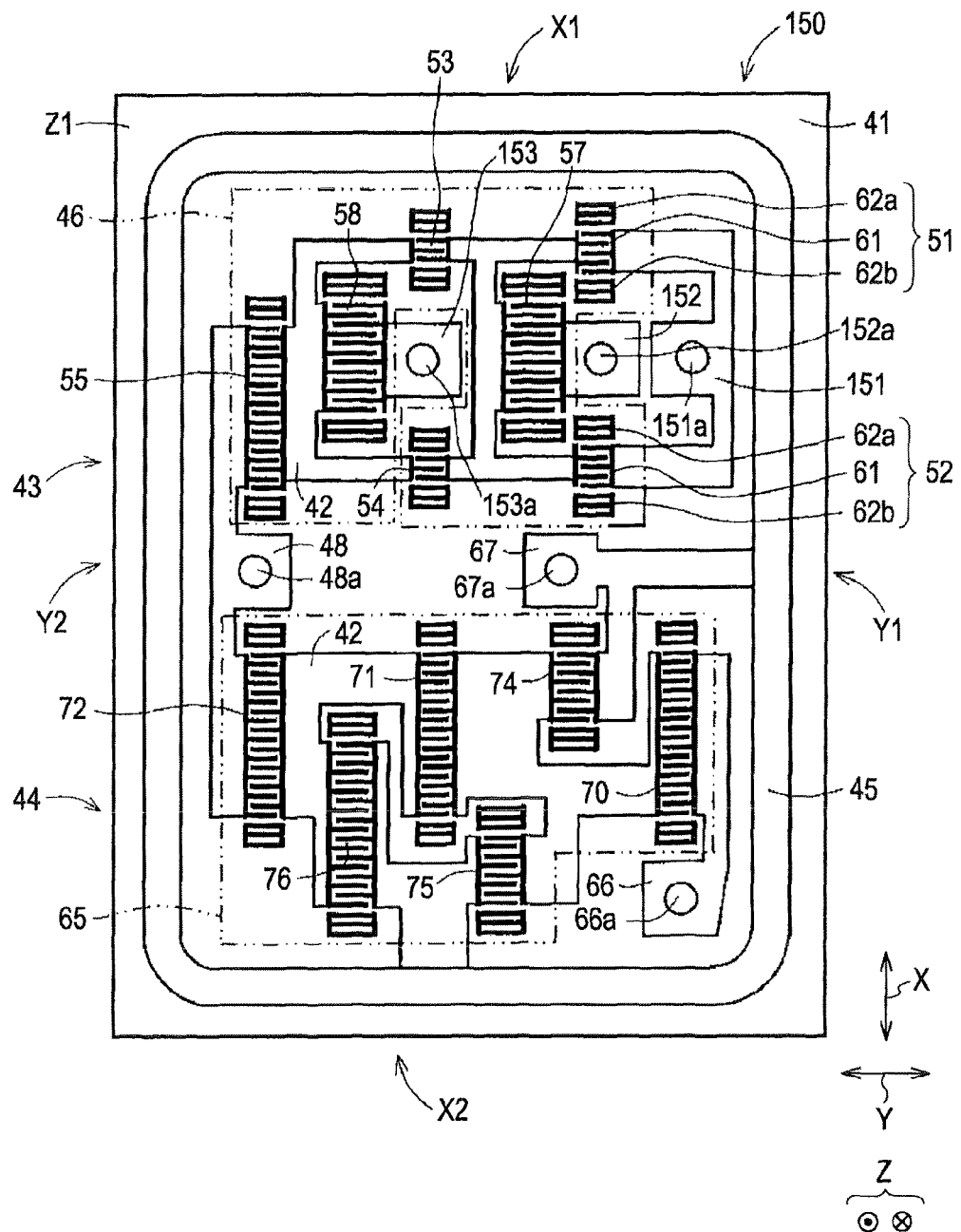
FIG. 9 is a plan view that schematically illustrates an example of the configuration of a surface acoustic wave element according to a fourth embodiment of the invention.
Figure 10:
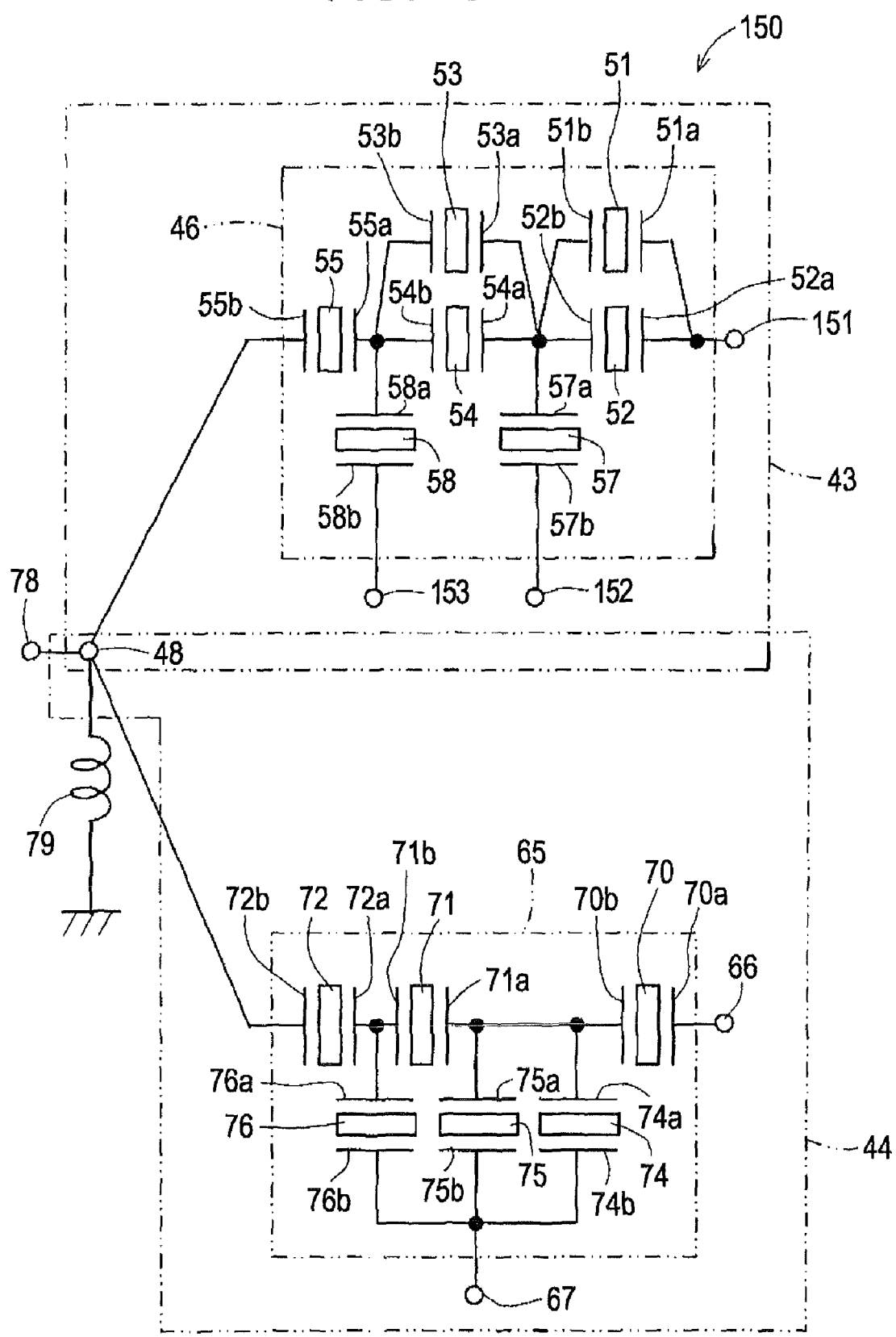
FIG. 10 is a diagram that schematically illustrates an example of an equivalent circuit of the surface acoustic wave element that is shown in FIG. 9.

In the following description, a fourth exemplary embodiment of the invention is explained while referring to FIGS. 9 and 10. The configuration of a surface acoustic wave element 150 is substantially and/or fundamentally the same, with some exceptions, as that of the surface acoustic wave element 40 explained earlier. Therefore, in the following description of the surface acoustic wave element 150, the same reference numerals are consistently used for the same components as those of the surface acoustic wave element 40 so as to omit, if appropriate, any redundant explanation or simplify explanation thereof.

The configuration of the first filter 43 of the surface acoustic wave element 150 differs from that of the surface acoustic wave element 40 according to the first exemplary embodiment of the invention explained earlier in that, in the former configuration, each of two parallel arms of the first group of resonators 46 is connected directly to the corresponding one of two ground electrodes. That is, the first parallel resonator 57 is connected to a first transmitting ground electrode 152, whereas the second parallel resonator 58 is connected to a second transmitting ground electrode 153.

More specifically, the first transmitting ground pad electrode 152a of the first transmitting ground electrode 152 is provided between the first serial resonator 51 and the second serial resonator 52. The second transmitting ground pad electrode 153a of the second transmitting ground electrode 153 is provided between the third serial resonator 53 and the fourth serial resonator 54.

With such a structure, after that the piezoelectric substrate 41 has been mounted on the circuit board 80, heat that is generated at the first serial arm of the first group of resonators 46, that is, the first serial resonator 51 and the second serial resonator 52, is collected at the first transmitting ground electrode 152 and then propagates through the first transmitting ground pad electrode 152a thereof toward and to the first ground pad terminal 85 of the circuit board 80. Then, this heat further propagates from the first ground pad terminal 85 of the circuit board 80 toward and to the common ground terminal 95 thereof. As a result thereof, this heat is radiated from the common ground terminal 95 of the circuit board 80. In addition, heat that is generated at the second serial arm of the first group of resonators 46, that is, the third serial resonator 53 and the fourth serial resonator 54, is collected at the second transmitting ground electrode 153 and then propagates through the second transmitting ground pad electrode 153a thereof toward and to the first ground pad terminal 85 of the circuit board 80. Then, this heat further propagates from the first ground pad terminal 85 of the circuit board 80 toward and to the common ground terminal 95 thereof. As a result thereof, this heat is also radiated from the common ground terminal 95 of the circuit board 80.

An input electrode 151 includes a conductive film and a first input pad electrode 151a. The conductive film of the input electrode 151 extends from the connection electrode 42.

The first input pad electrode 151a is formed on the conductive film. The first transmitting ground electrode 152 includes a conductive film and the first transmitting ground pad electrode 152a. The conductive film of the first transmitting ground electrode 152 extends from the connection electrode 42. The first transmitting ground pad electrode 152a is formed on the conductive film. The second transmitting ground electrode 153 includes a conductive film and the second transmitting ground pad electrode 153a. The conductive film of the second transmitting ground electrode 153 extends from the connection electrode 42. The second transmitting ground pad electrode 153a is formed on the conductive film. The first transmitting ground electrode 152 and the second transmitting ground electrode 153 are separated from each other. In other words, the first transmitting ground electrode 152 and the second transmitting ground electrode 153 are formed on the first surface Z1 of the piezoelectric substrate 41 in such a manner that they are not electrically connected to each other. Each of the first input pad electrode 151a of the input electrode 151, the first transmitting ground pad electrode 152a of the first transmitting ground electrode 152, and the second transmitting ground pad electrode 153a of the second transmitting ground electrode 153 is formed to have a projected shape of a circle if it is assumed to be projected on a virtual plane that is perpendicular to the thickness direction Z of the piezoelectric substrate 41.

The first input pad electrode 151a of the input electrode 151 is provided at an intermediate position between the first side Y1 defined above and the center line of the surface acoustic wave element 150 of the invention extending in the X direction and defined as the center when viewed in the width direction Y. It should be noted that the position is not a halfway position but an intermediate position that is closer to the first side Y1 than the centerline.

The first transmitting ground pad electrode 152a of the first transmitting ground electrode 152 is provided between the first serial resonator 51 and the second serial resonator 52 at a position distanced, in the length direction X, both from the second reflector 62b of the first serial resonator 51, which is one of two reflectors thereof collectively denoted as 62 that is provided closer to the first transmitting ground pad electrode 152a than the other, and from the first reflector 62a of the second serial resonator 52, which is one of two reflectors thereof collectively denoted as 62 that is provided closer to the first transmitting ground pad electrode 152a than the other. The distance from the second reflector 62b of the first serial resonator 51 to the first reflector 62a of the second serial resonator 52 may be set at an arbitrary value. In the configuration of the surface acoustic wave element 150 of the invention, the distance mentioned above is set at 80 μm.

The second transmitting ground pad electrode 153a of the second transmitting ground electrode 153 is provided between the third serial resonator 53 and the fourth serial resonator 54 at a position distanced, in the length direction X, both from the second reflector 62b of the third serial resonator 53, which is one of two reflectors thereof collectively denoted as 62 that is provided closer to the second transmitting ground pad electrode 153a than the other, and from the first reflector 62a of the fourth serial resonator 54, which is one of two reflectors thereof collectively denoted as 62 that is provided closer to the second transmitting ground pad electrode 153a than the other. The distance from the second reflector 62b of the third serial resonator 53 to the first reflector 62a of the fourth serial resonator 54 may be set at an arbitrary value. In the configuration of the surface acoustic wave element 150, the distance mentioned above is set at 100 μm. With such a structure, after that the piezoelectric substrate 41 has been mounted on the circuit board 80, it is possible to radiate heat that is generated at the first serial arm of the first group of resonators 46, that is, the first serial resonator 51 and the second serial resonator 52, via the first transmitting ground electrode 152, which has the first transmitting ground pad electrode 152a. In addition, it is possible to radiate heat that is generated at the second serial arm of the first group of resonators 46, that is, the third serial resonator 53 and the fourth serial resonator 54, via the second transmitting ground electrode 153, which has the second transmitting ground pad electrode 153a.

Next, with reference to FIGS. 11 and 12, a few examples of the configuration of an apparatus that is provided with a surface acoustic wave apparatus having a surface acoustic wave element of the invention are explained below.

Figure 11:
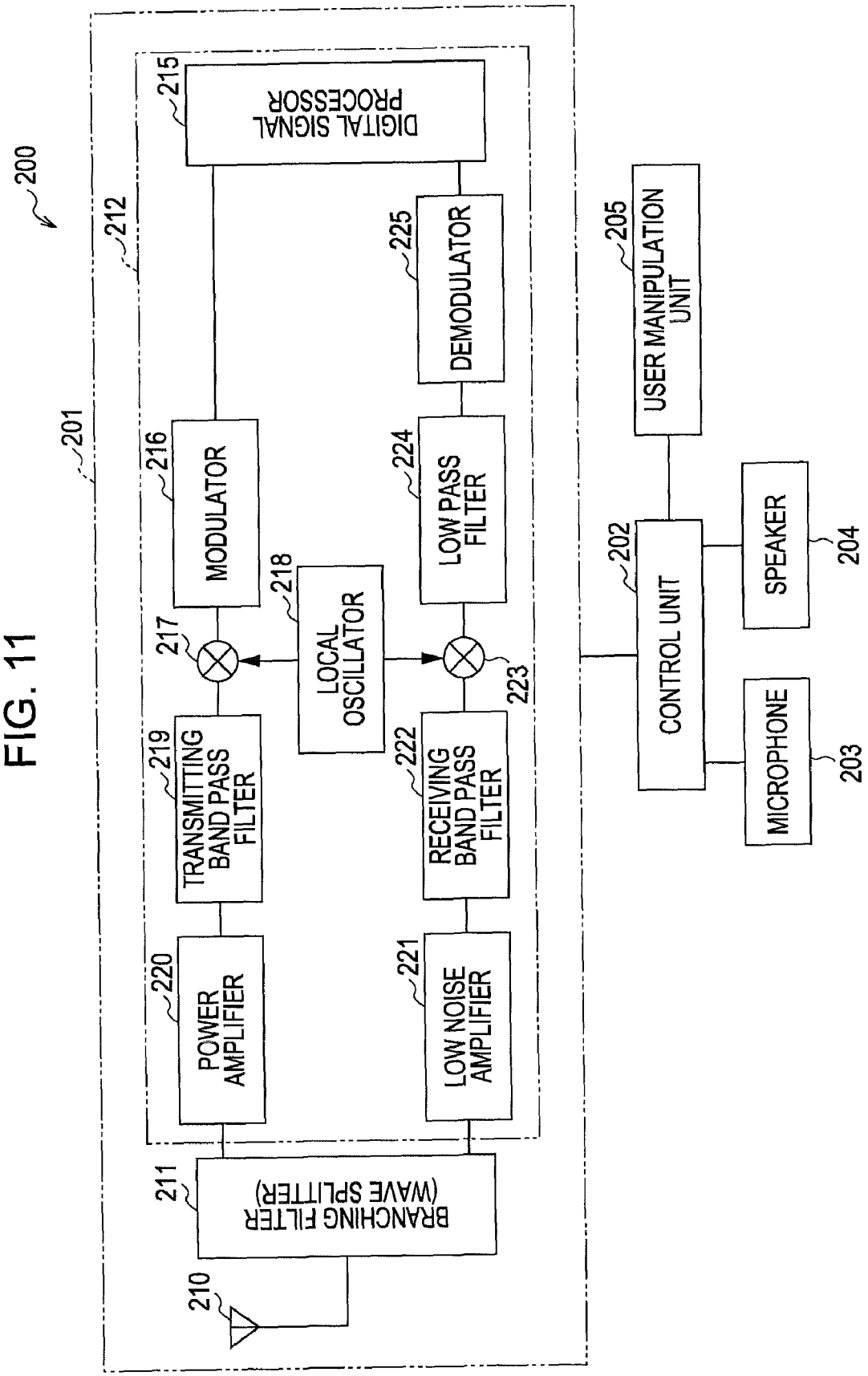
FIG. 11 is a block diagram that schematically illustrates an example of the configuration of a communication apparatus according to an exemplary embodiment of the invention.

A communication apparatus 200 shown in FIG. 11 is embodied as, for example, a mobile phone. The communication apparatus 200 is provided with a transceiver unit 201, which is a transmission/reception unit. In addition to the transceiver unit 201, the communication apparatus 200 is further provided with a control unit 202, a microphone 203, a speaker (or a set of speakers) 204, and a user manipulation unit 205. The transceiver unit 201 includes an antenna 210, a branching filter 211, and a transmission/reception processing unit 212. The branching filter 211, which is a duplexer, is in this embodiment provided with the surface acoustic wave apparatus 100, which is illustrated in FIG. 4. The transmission/reception processing unit 212 is provided with a digital signal processor 215, a modulator 216, a transmitting mixer 217, a local oscillator 218, a transmitting band pass filter 219, a power amplifier 220, a low noise amplifier 221, a receiving band pass filter 222, a receiving mixer 223, a low pass filter 224, and a demodulator 225. In the following description, the transmitting band pass filter 219 is referred to as "transmitting BPF", whereas the receiving band pass filter 222 is referred to as "receiving BPF". The digital signal processor 215 is abbreviated as "DSP" hereafter. The low pass filter 224 is abbreviated as "LPF" hereafter. The control unit 202 is connected to the transceiver unit 201. Each of the microphone 203, the speaker 204, and the user manipulation unit 205 is connected to the control unit 202.

The user manipulation unit 205 has a plurality of "manipulation pieces" such as manual operation keys, manual operation buttons, and the like, which are manipulated by a user. When a user manipulates these manual operation pieces, the user manipulation unit 205 generates a signal(s) that indicates information on the user manipulation, and then supplies the generated signal to the control unit 202 as a user input. For example, numeric information, alphabetic information (i.e., textual information), and user command information as instructions given by the user to the communication apparatus 200, are supplied from the user manipulation unit 205 to the control unit 202. Such a user interface configuration makes it possible for a user to input various kinds of data/information in the communication apparatus 200 by manipulating the manual operation pieces of the user manipulation unit 205. The control unit 202 is embodied as, for example, a set of components that includes a central processing unit (CPU). The control unit 202 controls the operation of the transceiver unit 201, the microphone 203, the speaker 204, and the user manipulation unit 205 on the basis of a control program that is stored in the control unit 202.

An analog signal that is generated as a result of the manipulation of the user manipulation unit 205 by a user or as a result of the pickup of sound at the microphone 203, that is, audio input via the microphone 203, is subjected to analog-to-digital (A/D) conversion processing at the control unit 202. After the A/D conversion, the digital signal is supplied to the DSP 215. Upon reception of the digital audio signal from the control unit 202, the DSP 215 performs data compression on the received signal and synchronization processing in conformity with a time division multiplex access scheme, which is known well as TDMA. Thereafter, the DSP 215 performs waveform shaping so as to form a base band signal. The modulator 216 generates a modulated wave on the basis of a predetermined modulation scheme (i.e., modulation method) that is set for this mobile phone. The transmitting mixer 217 multiplies an oscillation signal that has a predetermined oscillation frequency, which is generated by the local oscillator 218, by a modulated wave that is supplied from the modulator 216 so as to perform frequency conversion. The transmitting BPF 219 attenuates any unnecessary signal component that is contained in the signal that has been subjected to frequency conversion at the transmitting mixer 217. After the attenuation of any unnecessary signal component contained therein at the transmitting BPF 219, the power amplifier 220 amplifies the signal level thereof to desired signal strength. The amplified signal goes though the duplexer 211, which separates a transmitting frequency band signal from a receiving frequency band signal, and then is transmitted from the antenna 210 to other communication apparatus.

On the other hand, a signal that is received at the antenna 210 passes through the duplexer 211 to be inputted in the low noise amplifier 221. After having been amplified at the low noise amplifier 221, the signal is supplied to the receiving BPF 222. Any unnecessary signal component that is contained therein is attenuated at the receiving BPF 222. Thereafter, the processed signal is inputted in the receiving mixer 223. The receiving mixer 223 multiplies an oscillation signal that has a predetermined oscillation frequency, which is generated by the local oscillator 218, by the attenuated signal that is supplied from the receiving BPF 222 so as to perform frequency conversion. The LPF 224 removes the signal components of any unnecessary frequency band from the frequency-converted signal. In such processing, the LPF 224 selectively passes signal components having some frequencies that are not higher than a predetermined cutoff frequency; or, in other words, the LPF 224 passes signal components having "less-than-cutoff frequency" only. The signal that has passed through the LPF 224 is supplied to the demodulator 225. The demodulator 225 performs demodulation on the signal that is inputted from the LPF 224. The demodulated audio signal is inputted in the DSP 215. Upon the reception of the demodulated audio signal from the demodulator 225, which is a compressed digital audio signal, the DSP 215 performs decompression and subsequently performs digital-to-analog (D/A) conversion thereon. The decompressed analog signal is outputted as sound from the speaker 204.

As has already been explained in detail above, if a surface acoustic wave apparatus having a surface acoustic wave element according to any of the foregoing exemplary embodiments of the invention, herein, the surface acoustic wave apparatus 100 shown in FIG. 4, is adopted, the transmission/reception processing unit 212 of the transceiver unit 201 of the communication apparatus 200 can transmit a signal to another communication apparatus from/through the antenna 210, which is connected to the common terminal 94, there being a signal supplied to the first input terminal 93 of the duplexer 211. In addition, through the reception of a signal from the second output terminal 96 of the duplexer 211, the transmission/reception processing unit 212 of the transceiver unit 201 of the communication apparatus 200 can receive a signal that is transmitted from another communication apparatus. The communication apparatus 200 is provided with the surface acoustic wave apparatus 100 that has the surface acoustic wave element 40, which features an improved yield rate without causing an increase in the size of resonators, enhanced durability characteristics, and more stable frequency characteristics, thereby offering greater reliability. Therefore, the communication apparatus 200 makes it possible to, for example, transmit and receive a signal with excellent quality without transmitting or receiving any signal having an unwanted frequency that is outside a predetermined band pass frequency range.

In the foregoing description of an application example of an aspect of the invention, it is explained that the communication apparatus 200 is provided with the duplexer 211 that has the surface acoustic wave apparatus 100. However, the scope of the invention is not limited at all to such an exemplary configuration. For example, a communication apparatus may be provided with, in the configuration of a duplexer thereof, a surface acoustic wave apparatus having a surface acoustic wave element according to any of the foregoing second, third, and fourth embodiments of the invention in place of the surface acoustic wave apparatus 100 that has the surface acoustic wave element 40 according to the first embodiment of the invention. A communication apparatus having such a modified configuration offers the same advantageous effects as those of the communication apparatus 200, which is provided with the duplexer 211 that includes the surface acoustic wave apparatus 100.

Figure 12:
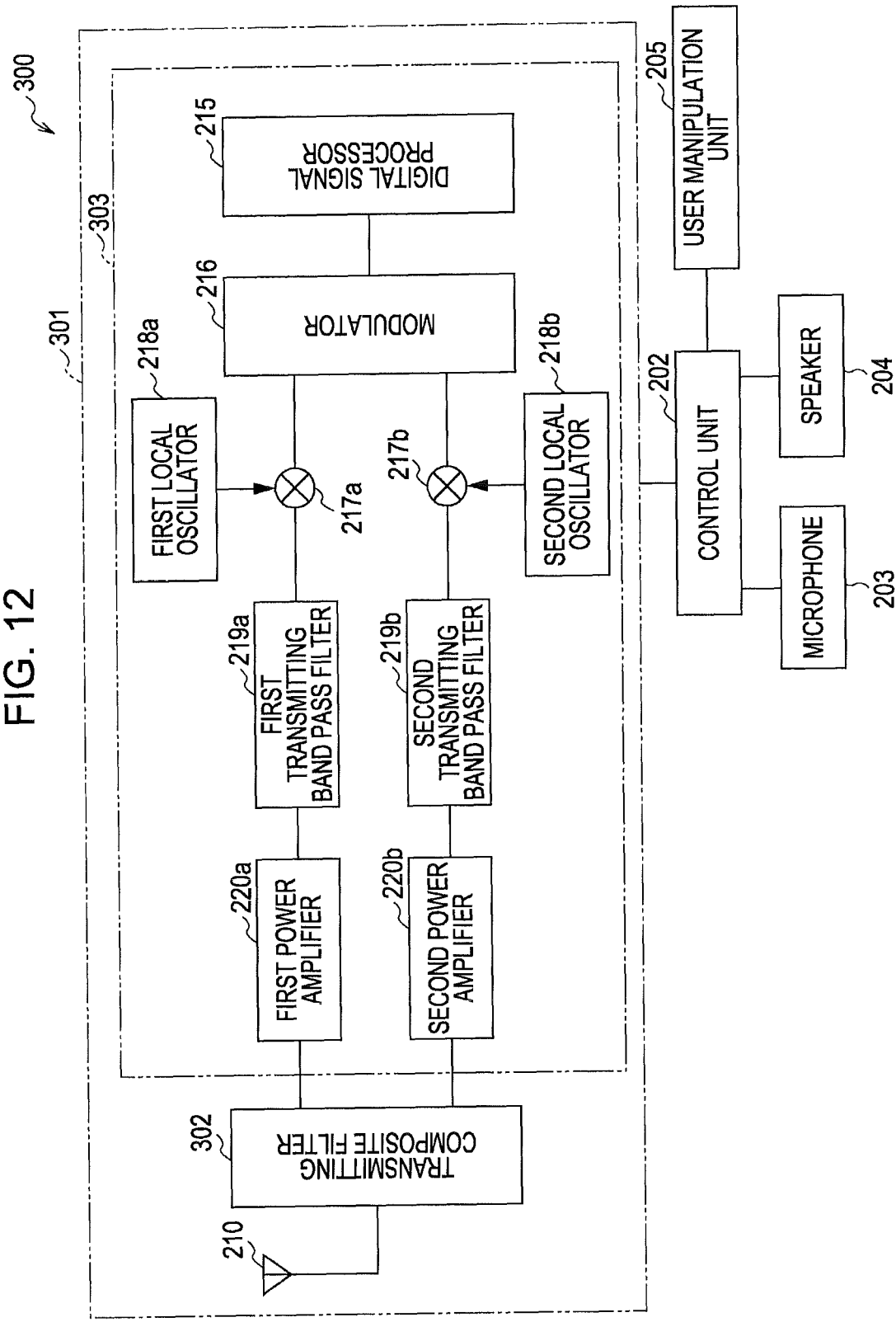
FIG. 12 is a block diagram that schematically illustrates an example of the configuration of a transmission apparatus according to an exemplary embodiment of the invention.

FIG. 12 is a block diagram that schematically illustrates an example of the configuration of a transmission apparatus 300 according to an exemplary embodiment of the invention. The configuration of the transmission apparatus 300 of the invention is similar to, with some exceptions, the configuration of the communication apparatus 200 explained above. Therefore, in the following description of the transmission apparatus 300, the same reference numerals are consistently used for the same components as those of the communication apparatus 200 so as to omit, if appropriate, any redundant explanation or simplify explanation thereof. The transmission apparatus 300 is provided with a transmitting unit 301, the control unit 202, the microphone 203, the speaker (or a set of speakers) 204, and the user manipulation unit 205. The transmitting unit 301 includes the antenna 210, a transmitting composite filter 302, and a transmission-processing unit 303. The transmitting composite filter 302 is provided with the surface acoustic wave apparatus 100 that has the surface acoustic wave element 40 according to the first embodiment of the invention.

The transmitting composite filter 302 is formed as, or includes, a surface acoustic wave apparatus that has a plurality of filters. Specifically, in the configuration of the transmission apparatus 300 described herein, the transmitting composite filter 302 includes a surface acoustic wave apparatus that has two filters, which is a first filter and a second filter. Each of the first filter and the second filter is a surface acoustic wave filter. The transmitting composite filter 302 has a common electrode functioning as the output electrode of the first filter and the output electrode of the second filter.

The transmission processing unit 303 is provided with the digital signal processor (DSP) 215, the modulator 216, a first transmitting mixer 217a, a first local oscillator 218a, a first transmitting band pass filter 219a, a first power amplifier 220a, a second transmitting mixer 217b, a second local oscillator 218b, a second transmitting band pass filter 219b, and a second power amplifier 220b. The first transmitting band pass filter 219a is referred to as "first transmitting BPF", whereas the second transmitting band pass filter 219b is referred to as "second transmitting BPF". The control unit 202 is connected to the transmitting unit 301.

The first transmitting mixer 217a multiplies an oscillation signal that has a predetermined oscillation frequency, which is generated by the first local oscillator 218a, by a modulated wave that is supplied from the modulator 216 so as to perform frequency conversion. The first transmitting BPF 219a attenuates any unnecessary signal component that is contained in the signal that has been subjected to frequency conversion at the first transmitting mixer 217a. After the attenuation of any unnecessary signal component contained therein at the first transmitting BPF 219a, the first power amplifier 220a amplifies the signal level thereof to desired signal strength. Then, the amplified signal is inputted from the first power amplifier 220a into the transmitting composite filter 302.

On the other hand, the second transmitting mixer 217b multiplies an oscillation signal that has a predetermined oscillation frequency, which is generated by the second local oscillator 218b, by a modulated wave that is supplied from the modulator 216 so as to perform frequency conversion. Herein, the oscillation frequency that is generated at the second local oscillator 218b differs from the oscillation frequency that is generated at the first local oscillator 218a. The second transmitting BPF 219b attenuates any unnecessary signal component that is contained in the signal that has been subjected to frequency conversion at the second transmitting mixer 217b. After the attenuation of any unnecessary signal component contained therein at the second transmitting BPF 219b, the second power amplifier 220b amplifies the signal level thereof to desired signal strength. Then, the amplified signal is inputted from the second power amplifier 220b into the transmitting composite filter 302. Each of the signal that is outputted from the first power amplifier 220a and the signal that is outputted from the second power amplifier 220b is inputted into either the first input terminal 93 of the transmitting composite filter 302 or the common terminal 94 thereof. Then, the signal is transmitted to another communication apparatus via the antenna 210.

As has already been explained in detail above, if a surface acoustic wave apparatus having a surface acoustic wave element according to any of the foregoing exemplary embodiments of the invention, herein, the surface acoustic wave apparatus 100 shown in FIG. 4, is adopted, the transmission processing unit 303 of the transmitting unit 301 of the transmission apparatus 300 can transmit a signal to another communication apparatus through the antenna 210, which is connected to the common terminal 94, a signal being supplied to the first input terminal 93 of the transmitting composite filter 302 or the common terminal 94 thereof.

The transmission apparatus 300 is provided with the surface acoustic wave apparatus 100 that has the surface acoustic wave element 40, which features an improved yield rate without causing an increase in the size of resonators, enhanced withstand characteristics, and more stable frequency characteristics, thereby offering greater reliability. Therefore, the transmission apparatus 300 makes it possible to, for example, transmit a signal with excellent quality without transmitting any signal having an unwanted frequency that is outside a predetermined band pass frequency range.

In the foregoing description of an application example of an aspect of the invention, it is explained that the transmission apparatus 300 is provided with the transmitting composite filter 302 that has the surface acoustic wave apparatus 100. However, the scope of the invention is not limited at all to such an exemplary configuration. For example, a transmission apparatus may be provided with, in the configuration of a transmitting composite filter thereof, a surface acoustic wave apparatus having a surface acoustic wave element according to any of the foregoing second, third, and fourth embodiments of the invention in place of the surface acoustic wave apparatus 100 that has the surface acoustic wave element 40 according to the first embodiment of the invention. A transmission apparatus having such a modified configuration offers the same advantageous effects as those of the transmission apparatus 300, which is provided with the transmitting composite filter 302 that includes the surface acoustic wave apparatus 100.

In the following description, the simulation result of operation/working-effect offered by a surface acoustic wave apparatus according to an exemplary embodiment of the invention and the simulation result of operation/working-effect offered by a surface acoustic wave apparatus according to a comparative example are explained. The simulation result of the operation of a surface acoustic wave apparatus according to an exemplary embodiment of the invention is shown below as Present Example 1. The simulation result of the operation of a surface acoustic wave apparatus according to a comparative example is shown below as Comparative Example 1.

Present Example 1

As a piezoelectric substrate according to an exemplary embodiment of the invention, a 38.70 Y-cut X propagation substrate that is made of a lithium tantalate single crystal is used. In addition, a pair of LTCC substrates is used as a circuit board. The surface acoustic wave element 40 that is shown in FIG. 1 is mounted on the circuit board 80 that is shown in FIG. 3 so as to make up the surface acoustic wave apparatus 100 that is shown in FIG. 4. Under the following operation conditions, the temperature of the first serial resonator 51 and the second serial resonator 52 of the first group of resonators 46 of the surface acoustic wave apparatus 100 is simulated. In such a simulation, the temperature of the first serial resonator 51 and the second serial resonator 52 is found under the assumption that each of the surface acoustic wave element 40 and the circuit board 80 is exposed to air.

It is assumed that a signal with power of 1 W is inputted in the first input pad electrode 47a of the input electrode 47. An insertion loss is assumed to be 2.5 dB. A voltage standing wave ratio, which is abbreviated as "VSWR", is assumed to be 1.5. It is further assumed that heat of 0.4 W is applied to the first serial resonator 51 and the second serial resonator 52, which are closest to the input electrode 47. The atmospheric temperature is assumed to be 25° C. The coefficient of heat transfer is assumed to be $2.0 \times 10^3$ W/m$^2$K. In addition, it is assumed that the heat conductivity of the piezoelectric substrate 41 is 4.1 W/mK, whereas the heat conductivity of the circuit substrate 80 is assumed to be 3.9 W/mK. The heat conductivity of solder, which is an electro-conductive member, is assumed to be 61 W/mK. The heat conductivity of each of the first feed-through electrodes 90 and the second feed-through electrodes 92, which are made of silver (Ag), is assumed to be 150 W/mK. The heat conductivity of air is assumed to be $2.6 \times 10^{-2}$ W/mK. Finally, it is assumed that the heat conductivity of the IDT electrode 61 of the serial resonator is 203.3 W/mK.

As a result of simulation performed under the operation conditions described above, the temperature of the first serial resonator 51 and the second serial resonator 52 is found as 92.8° C.

Comparative Example 1

A surface acoustic wave element of the related art is mounted on the circuit board 80 so as to make up a surface acoustic wave apparatus of the comparative example 1. Under the same operation conditions as those of a surface acoustic wave apparatus according to the present example 1 described above, the temperature of a first serial resonator 10 is found as a result of simulation. As a result of simulation performed under the same operation conditions as above, the temperature of the first serial resonator 10 is found as 103.9° C.

As explained above, the temperature of the first serial resonator 51 and the second serial resonator 52 according to the present example 1 is lower than that of the first serial resonator 10 according to the comparative example 1. Thus, a surface acoustic wave apparatus according to an exemplary embodiment of the invention, for example, the surface acoustic wave apparatus 100 described above, has enhanced durability characteristics, which are better in comparison to those of a surface acoustic wave apparatus according to the comparative example 1.

The present invention may be modified, altered, changed, adapted, and/or improved within a range not departing from the gist, spirit, and/or fundamental features of the invention apprehended by a person skilled in the art from explicit and implicit description made herein. Accordingly, it should be understood that specific features, components, elements, methods, and the like that are described in the foregoing exemplary embodiments of the invention are nothing more than mere examples that are disclosed for the purpose of facilitating the understanding of the invention without any intention to limit the legal scope thereof. For the interpretation of the legal scope of the invention, the recitation of appended claims should be referred to. It should be further noted that any modification, alteration, change, adaptation, and/or improvement that is made without departing from the essence of the invention that is recited in the appended claims is encompassed within the legal scope of the invention.

Non-limiting examples of the modification, alteration, change, adaptation, and/or improvement of the foregoing exemplary embodiments of the invention are explained below. It is explained that, in the layout configuration of the surface acoustic wave element 40 according to the first embodiment of the invention, which is shown in FIGS. 1, 2, 3, and 4, the input electrode 47 is provided between the first serial resonator 51 and the second serial resonator 52 in the first group of resonators 46 thereof. However, the scope of this aspect of the invention is not limited thereto. For example, the first ground electrode 49 may be provided between the first serial resonator 51 and the second serial resonator 52 in the first group of resonators 46 thereof in place of the input electrode 47. It is explained in the foregoing exemplary embodiments of the invention that a surface acoustic wave element is bonded to the circuit board 80. However, the scope of this aspect of the invention is not limited thereto. For example, a surface acoustic wave element may be mounted directly on the substrate of a communication apparatus such as a mobile phone or the like. It is explained in the foregoing exemplary embodiments of the invention that the matching circuit unit 79 is provided on the second layer circuit substrate 82 of the circuit board 80, that is, between the first layer circuit substrate 81 and the second layer circuit substrate 82. However, the scope of this aspect of the invention is not limited thereto. For example, the matching circuit unit 79 may be provided on the circuit substrate that is opposite the second layer circuit substrate 82 of the circuit board 80, that is, the first layer circuit substrate 81. As another example, the matching circuit unit 79 may be provided on any substrate or the like other than the first layer circuit substrate 81 of the circuit board 80 and the second layer circuit substrate 82 thereof, that is, outside the circuit board 80 or separately therefrom.

It is explained in the foregoing exemplary embodiments of the invention that the first filter 43 and the second filter 44 are formed on the same single piezoelectric substrate 41. Notwithstanding the foregoing, however, the first filter 43 may be formed on one piezoelectric substrate whereas the second filter 44 may be formed on another piezoelectric substrate that is different and/or separated from the first piezoelectric substrate.

Although it is preferable that each of the first input pad electrodes 47a, 121a, and 151a of the input electrodes 47, 121, and 151, the common pad electrode 48a of the common electrode 48, the first ground pad electrode 49a of the first ground electrode 49, the second output pad electrode 66a of the output electrode 66, the second ground pad electrode 67a of the second ground electrode 67, the first transmitting ground pad electrodes 122a and 152a of the first transmitting ground electrodes 122 and 152, and the second transmitting ground pad electrodes 123a and 153a of the second transmitting ground electrodes 123 and 153 should be formed to have a projected shape of a circle if it is assumed to be projected on a virtual plane that is perpendicular to the thickness direction Z of the piezoelectric substrate 41, each or any thereof may have an alternative shape other than a circle. For example, it may, or they may, have a polygonal shape. Although their projected shapes are not limited to a circle, it is preferable that all pad electrodes except the pad electrode of the ring electrode 45 should have the same area (i.e., area size) as one another when they are projected on a virtual plane that is perpendicular to the thickness direction Z of the piezoelectric substrate 41. If they have the same projected area as one another, it is possible to make the amount of solder uniform. Such uniform soldering amount ensures the bonding/adhesion of the piezoelectric substrate 41 and the circuit board 80.

Although a gold bump can be used as an electro-conductive member, it is preferable to use a conductive paste such as silver (Ag) or solder because if so it is possible to form all bumps in a single formation process.

It is explained in the foregoing exemplary embodiments of the invention shown in FIGS. 1-12 that each of the first filter 43 and the second filter 44 is formed as a ladder filter. However, the scope of this aspect of the invention is not limited thereto. For example, it may be formed as a dual mode filter, a lattice filter, or an "interdigitated inter-digital transducer" filter, which is abbreviated as an IIDT filter. Even in a case where each of the first filter 43 and the second filter 44 is formed as a dual mode filter, a lattice filter, or an IIDT filter, it is possible to achieve the same advantageous effects of the invention as those offered by the configurations described in the foregoing exemplary embodiments of the invention shown in FIGS. 1-12.

What is claimed is:
1. A surface acoustic wave element comprising:
a piezoelectric substrate;
a first filter on the piezoelectric substrate;
an input electrode configured for inputting a signal in the first filter;
an output electrode configured for outputting a signal from the first filter; and
a ground electrode to which a ground potential is applied,
wherein the first filter comprises at least one serial arm that comprises at least one resonator;
a first serial arm that is closest to the input electrode comprises a first serial arm portion and a second serial arm portion that are connected in parallel with each other;
each of the first serial arm portion and the second serial arm portion comprises at least one resonator; and either the input electrode or the ground electrode is laced between the first serial arm portion and the second serial arm portion;

wherein when the ground electrode is placed between the first serial arm portion and the second serial arm portion, the ground electrode is connected to a parallel resonator of the first filter on the piezoelectric substrate.

2. The surface acoustic wave element according to claim 1, wherein the first filter comprises a second serial arm that is connected to the first serial arm; the second serial arm comprises a third serial arm portion and a fourth serial arm portion that are connected in parallel with each other; each of the third serial arm portion and the fourth serial arm portion comprises at least one resonator; and a ground electrode is between the third serial arm portion and the fourth serial arm portion.

3. The surface acoustic wave element according to claim 2, wherein the ground electrode includes a first ground electrode that is between the first serial arm portion and the second serial arm portion and a second ground electrode that is between the third serial arm portion and the fourth serial arm portion; and the second ground electrode is electrically connected to the first ground electrode on the piezoelectric substrate.

4. The surface acoustic wave element according to claim 2, wherein the ground electrode includes a first ground electrode that is between the first serial arm portion and the second serial arm portion and a second ground electrode that is between the third serial arm portion and the fourth serial arm portion; and the first ground electrode and the second ground electrode are provided as two different electrodes that are separated from and/or independent of each other.

5. The surface acoustic wave element according to claim 1, further comprising a second filter on the piezoelectric substrate, the second filter comprising at least a resonator, wherein the first filter is a transmitting filter whereas the second filter is a receiving filter.

6. The surface acoustic wave element according to claim 1, wherein a ring electrode is surrounds the filter at a peripheral area on the surface of the piezoelectric substrate.

7. The surface acoustic wave element according to claim 6, wherein the ring electrode is grounded.

8. A surface acoustic wave apparatus comprising:
the surface acoustic wave element according to claim 1; and
a circuit board, on which the surface acoustic wave element is mounted, configured for facing the surface of the piezoelectric substrate,
wherein a board connection input terminal that is connected to the input electrode is on a first surface of the circuit board, which is one of two surfaces of the circuit board viewed in the thickness direction thereof and on which the surface acoustic wave element is mounted;
a board connection output terminal that is connected to the output electrode is on the first surface of the circuit board;
a board connection ground terminal that is connected to the ground electrode is on the first surface of the circuit board;
a wiring connection input terminal that is connected to the board connection input terminal via a terminal connection electrode, which is formed through the circuit board viewed in the thickness direction thereof, is on a second surface of the circuit board, which is the other of two surfaces of the circuit board viewed in the thickness direction thereof;
a wiring connection output terminal that is connected to the board connection output terminal via the terminal connection electrode is on the second surface of the circuit board; and
a wiring connection ground terminal that is connected to the board connection ground terminal via the terminal connection electrode is on the second surface of the circuit board.

9. A communication apparatus comprising:
a duplexer that comprises the surface acoustic wave apparatus according to claim 8;
an antenna that is electrically connected to the wiring connection output terminal; and
a transceiver section that supplies a signal to the wiring connection input terminal and receives a signal from the wiring connection output terminal.

10. A method for dissipating heat from a surface acoustic wave (SAW) device comprising at least one serial arm having a first serial arm portion comprising one resonator and a second serial arm portion comprising at least one resonator, the method comprising:
configuring the resonators of the serial arm portions of the SAW device in parallel and to have a spacing between them of at least 60 microns; and
placing one of an input electrode or a ground electrode between said first and second serial arm portions;
wherein when the ground electrode is placed between the first serial arm portion and the second serial arm portion, the ground electrode is connected to a parallel resonator of the first filter on the piezoelectric substrate.

11. The method of claim 10, in which the SAW device further comprises a second serial arm having a third serial arm portion comprising at least one resonator and a fourth serial arm portion comprising at least one resonator, and in which an input electrode is placed between said first and second serial arm portions and a ground electrode is placed between the third and fourth serial arm portions.

12. A surface acoustic wave element comprising:
a piezoelectric substrate;
a first filter on the piezoelectric substrate;
an input electrode configured for inputting a signal in the first filter;
an output electrode configured for outputting a signal from the first filter; and
a ground electrode to which a ground potential is applied,
wherein the first filter comprises at least one serial arm that comprises at least one resonator;
a first serial arm that is closest to the input electrode comprises a first serial arm portion and a second serial arm portion that are connected in parallel with each other;
each of the first serial arm portion and the second serial arm portion comprises at least one resonator; and
the input electrode is placed between the first serial arm portion and the second serial arm portion; and
the first filter comprises a second serial arm that is connected to the first serial arm, wherein the second serial arm comprises a third serial arm portion and a fourth serial arm portion that are connected in parallel with each other; each of the third serial arm portion and the fourth serial arm portion comprises at least one resonator; and a ground electrode is placed between the third serial arm portion and the fourth serial arm portion.

13. A surface acoustic wave element comprising:
a piezoelectric substrate;
a first filter on the piezoelectric substrate;
an input electrode configured for inputting a signal in the first filter;

an output electrode configured for outputting a signal from the first filter; and a ground electrode to which a ground potential is applied, wherein the first filter comprises at least one serial arm that comprises at least one resonator;

a first serial arm that is closest to the input electrode comprises a first serial arm portion and a second serial arm portion that are connected in parallel with each other;

each of the first serial arm portion and the second serial arm portion comprises at least one resonator; and the first filter comprises a second serial arm that is connected to the first serial arm, wherein the second serial arm comprises a third serial arm portion and a fourth serial arm portion that are connected in parallel with each other; each of the third serial arm portion and the fourth serial arm portion comprises at least one resonator; and the ground electrode includes a first ground electrode that is between the first serial arm portion and the second serial arm portion and a second ground electrode that is between the third serial arm portion and the fourth serial arm portion; and the second ground electrode is electrically connected to the first ground electrode on the piezoelectric substrate.

* * * * *